(12) United States Patent
Ohtani

(10) Patent No.: US 10,825,909 B2
(45) Date of Patent: Nov. 3, 2020

(54) METHOD OF MANUFACTURING SEMICONDUCTOR DEVICE AND SEMICONDUCTOR DEVICE

(71) Applicant: SHINDENGEN ELECTRIC MANUFACTURING CO., LTD., Tokyo (JP)

(72) Inventor: Kinya Ohtani, Saitama (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 12 days.

(21) Appl. No.: 16/086,610

(22) PCT Filed: Mar. 31, 2016

(86) PCT No.: PCT/JP2016/060856
§ 371 (c)(1),
(2) Date: Sep. 20, 2018

(87) PCT Pub. No.: WO2017/168734
PCT Pub. Date: Oct. 5, 2017

(65) Prior Publication Data
US 2019/0123158 A1    Apr. 25, 2019

(51) Int. Cl.
| H01L 29/423 | (2006.01) |
| H01L 29/40 | (2006.01) |
| H01L 29/417 | (2006.01) |
| H01L 29/66 | (2006.01) |
| H01L 29/739 | (2006.01) |
| H01L 29/78 | (2006.01) |

(52) U.S. Cl.
CPC ...... H01L 29/42368 (2013.01); H01L 29/407 (2013.01); H01L 29/41766 (2013.01);
(Continued)

(58) Field of Classification Search
CPC ............ H01L 29/407; H01L 29/41766; H01L 29/42376; H01L 29/66348;
(Continued)

(56) References Cited

U.S. PATENT DOCUMENTS

| 8,558,308 B1 | 10/2013 | Blank et al. |
| 2009/0263952 A1 | 10/2009 | Viswanathan et al. |

(Continued)

FOREIGN PATENT DOCUMENTS

| JP | 2007-529115 A | 10/2007 |
| JP | 2012-64641 A | 3/2012 |

(Continued)

OTHER PUBLICATIONS

International Search Report in PCT/JP2016/060856, dated May 10, 2016, 4pp.

(Continued)

*Primary Examiner* — Marvin Payen
(74) *Attorney, Agent, or Firm* — Hauptman Ham, LLP

(57) ABSTRACT

A method of manufacturing a semiconductor device includes in the following order: a semiconductor base body preparing step; a first trench forming step; a first insulation film forming step; a gate insulation film forming step; a gate electrode forming step; a second trench forming step of forming a second trench in the inside of a first trench by removing a center portion of the first insulation film; a second insulation film forming step of forming a second insulation film in the inside of the second trench under a condition that a first gap remain in the inside of the second trench; a shield electrode forming step of forming a shield electrode in the inside of the first gap; a shield electrode etching back step of forming a second gap; and a source electrode forming step of forming a source electrode.

17 Claims, 18 Drawing Sheets

(52) U.S. Cl.
CPC .. *H01L 29/42376* (2013.01); *H01L 29/66348* (2013.01); *H01L 29/66727* (2013.01); *H01L 29/66734* (2013.01); *H01L 29/7397* (2013.01); *H01L 29/7813* (2013.01)

(58) Field of Classification Search
CPC ........... H01L 29/66727; H01L 29/7397; H01L 29/7813; H01L 29/423
USPC ........................................ 257/330, 332, 334
See application file for complete search history.

(56) References Cited

U.S. PATENT DOCUMENTS

| | | | |
|---|---|---|---|
| 2010/0171171 | A1 | 7/2010 | Hsu et al. |
| 2012/0061723 | A1 | 3/2012 | Ishii |
| 2012/0061754 | A1 | 3/2012 | Hsieh |
| 2017/0222037 | A1* | 8/2017 | Kishi .................... H01L 29/435 |

FOREIGN PATENT DOCUMENTS

| | | | |
|---|---|---|---|
| WO | 2005/065385 A2 | 7/2005 | |
| WO | WO-2016132551 A1 * | 8/2016 | ........... H01L 29/435 |

OTHER PUBLICATIONS

International Preliminary Report on Patentability in PCT/JP2016/060856, dated Aug. 24, 2017, 12pp.
Search Report in NL Application No. 2018614, dated Nov. 30, 2017, 11pp.

* cited by examiner

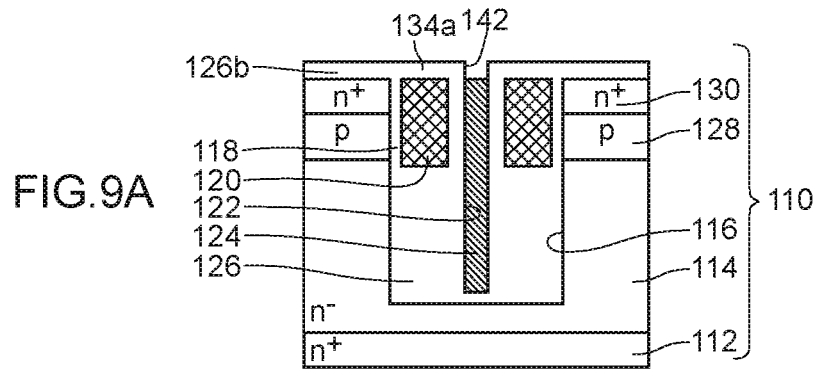
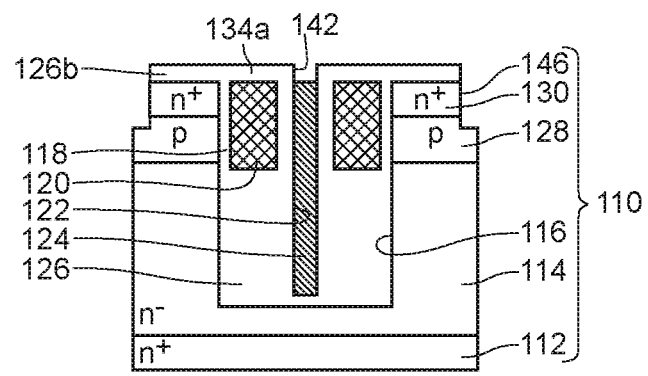
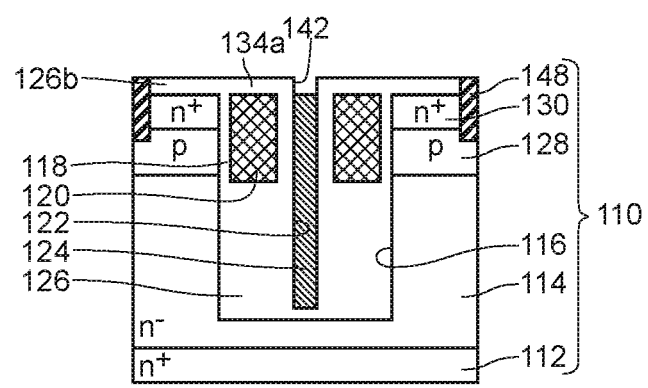
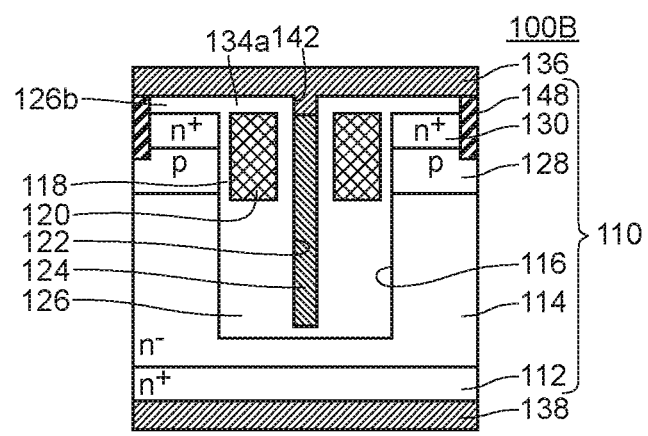

US 10,825,909 B2

METHOD OF MANUFACTURING SEMICONDUCTOR DEVICE AND SEMICONDUCTOR DEVICE

RELATED APPLICATIONS

The present application is a National Phase of International Application Number PCT/JP2016/060856, filed Mar. 31, 2016.

TECHNICAL FIELD

The present invention relates to a method of manufacturing a semiconductor device and a semiconductor device.

BACKGROUND ART

Conventionally, there has been known a semiconductor device which includes a shield gate structure of an in-plane direction separation type where a gate electrode and a shield electrode are separated from each other in an in-plane direction (see patent literature 1, for example).

As shown in FIG. 15A to FIG. 18C, a conventional semiconductor device 900 can be manufactured by carrying out the following method (a conventional method of manufacturing a semiconductor device). That is, the conventional semiconductor device 900 can be manufactured by carrying out (1) a semiconductor base body preparing step of preparing a semiconductor base body 910 having an n$^+$-type first semiconductor layer 912 and an n$^-$-type second semiconductor layer 914 having lower concentration than the first semiconductor layer 912 (see FIG. 15A), (2) a first trench forming step of forming a predetermined first trench 916 on the second semiconductor layer 914 (see FIG. 15B), (3) a first insulation film forming step of forming a first insulation film 926 in the inside of the first trench 916 by a thermal oxidation method under a condition that a first gap 922 remain at the center in the inside of the first trench 916 (see FIG. 15C), (4) a shield electrode forming step of forming a shield electrode 924 in the inside of the first gap 922 (see FIG. 15D and FIG. 16A), (5) a first insulation film etching back step of etching back the first insulation film 926 while leaving a lower portion of the first trench 916 (see FIG. 16B), (6) a gate insulation film forming step of forming a gate insulation film 918 in the inside of a recessed portion 950 under a condition that a second gap 952 remain in the inside of a recessed portion 950 formed of side walls of the shield electrode 924, side walls of an upper portion of the first trench 916 and an upper surface of the etched-back first insulation film 926 (see FIG. 16C), (7) a gate electrode forming step of forming a gate electrode 920 in the inside of the second gap 952 (see FIG. 16D and FIG. 17A), (8) a dopant region forming step of forming a base region 928, a source region 930 and a p$^+$-type contact region 932 (see FIG. 17B to FIG. 17D), (9) a protective insulation film forming step of forming a protective insulation film 934 on the shield electrode 924, the gate electrode 920 and the gate insulation film 918 (see FIG. 18A), (10) an insulation film removing step of removing insulation films (the gate insulation film and the protective insulation film) formed on a surface of the shield electrode 924 (see FIG. 18B), and (11) a source electrode forming step of forming a source electrode 936 such that the source electrode 936 is electrically connected to the shield electrode 924 (see FIG. 18C).

In the protective oxide film removing step, with the use of a CMP method, along with the removal of a protective insulation film 934' on a surface of the shield electrode 924, insulation films (the protective insulation film and the gate insulation film) formed on the source region 930 and the contact region 932 are also collectively removed.

CITATION LIST

Patent Literature

PTL 1: JP-T-2007-529115

SUMMARY OF INVENTION

Technical Problem

However, the conventional method of manufacturing a semiconductor device includes the gate electrode forming step as a step which comes after the shield electrode forming step. As a result, the insulation films (the gate insulation film and the protective insulation film) are formed above the shield electrode 924 by a step which comes before the source electrode forming step. Accordingly, to establish the connection between the shield electrode 924 and the source electrode 936, an insulation film removing step of removing the insulation films becomes necessary and hence, there exists a drawback that the step of establishing connection between the shield electrode 924 and the source electrode 936 becomes cumbersome.

In the above-mentioned conventional method of manufacturing a semiconductor device, with the use of a CMP method, along with the removal of the protective insulation film 934' formed above the shield electrode 924, the insulation films (the protective insulation film and the gate insulation film) formed on the source region 930 and the contact region 932 are also collectively removed. Accordingly, during a period of actual use (high and low temperature cycle) of the semiconductor device where slippage of the source electrode 936 in a horizontal direction is liable to occur, there is a possibility that such slippage occurs thus also giving rise to a drawback that stability of the electrode connection during a period of actual use (high and low temperature cycle) of the semiconductor device may be deteriorated.

The present invention has been made to overcome the above-mentioned drawbacks, and it is an object of the present invention to provide a method of manufacturing a semiconductor device where a step of establishing the connection between a shield electrode and a source electrode can be simplified, and stability of the electrode connection during a period of actual use (high and low temperature cycle) of the semiconductor device can be enhanced. It is another object of the present invention to provide a semiconductor device where stability of the electrode connection during a period of actual use (high and low temperature cycle) of the semiconductor device can be enhanced.

Solution to Problem

[1] A method of manufacturing a semiconductor device according to the present invention is a method of manufacturing a semiconductor device having a shield gate structure of an in-plane direction separation type where a gate electrode and a shield electrode are separated from each other in an in-plane direction, the method including in the following order: a semiconductor base body preparing step of preparing a semiconductor base body having a first conductive-type first semiconductor layer and a first conductive-type second semiconductor layer having lower concentration than the first semiconductor layer; a first trench forming step of forming a predetermined first trench on the second semiconductor layer; a first insulation film forming step of forming a first insulation film such that the first insulation film is filled in a lower portion of the first trench; a gate insulation film forming step of forming a gate insulation film on a side wall of an upper portion of the first trench; a gate electrode forming step of forming the gate electrode made of polysilicon with the gate insulation film interposed between the upper portion of the first trench and the gate electrode; a second trench forming step of forming a second trench in the inside of the first trench by removing a center portion of the first insulation film by etching; a second insulation film forming step of forming a second insulation film at least in the inside of the second trench under a condition that a first gap remain in the inside of the second trench; a shield electrode forming step of forming the shield electrode in the inside of the first gap; a shield electrode etching back step of forming a second gap in an upper portion of the first gap by removing a portion of the shield electrode by etching back; and a source electrode forming step of forming a source electrode such that the source electrode is electrically connected to the shield electrode.

[2] In the method of manufacturing a semiconductor device according to the present invention, it is preferable that, in the second insulation film forming step, the second insulation film be formed also on the gate electrode, and in the shield electrode etching back step, a depth position of an upper surface of the shield electrode as measured from a surface of the second insulation film formed on the gate electrode which is used as a reference be set to a value which falls within a range of from 0.01 μm to 2 μm.

[3] In the method of manufacturing a semiconductor device according to the present invention, it is preferable that, in the source electrode forming step, the source electrode be formed such that the source electrode is directly connected to the shield electrode.

[4] In the method of manufacturing a semiconductor device according to the present invention, it is preferable that, the method further include a shield electrode connecting metal plug forming step of forming a shield electrode connecting metal plug by filling the second gap with metal between the shield electrode etching back step and the source electrode forming step, wherein in the source electrode forming step, the source electrode be formed such that the source electrode is connected to the shield electrode through the shield electrode connecting metal plug.

[5] In the method of manufacturing a semiconductor device according to the present invention, it is preferable that, in the shield electrode etching back step, the second gap be formed only in a predetermined region of a region where the first gap is formed as viewed in a plan view.

[6] In the method of manufacturing a semiconductor device according to the present invention, it is preferable that, in the second trench forming step, a trench having side surfaces which form a bottom narrowed tapered shape be formed as the second trench.

[7] In the method of manufacturing a semiconductor device according to the present invention, it is preferable that, the method further include: a base region forming step of forming a second conductive-type base region on a surface of the second semiconductor layer in a region where the first trench is not formed as viewed in a plan view; and a first conductive-type high concentration diffusion region forming step of forming a first conductive-type high concentration diffusion region on a surface of the base region such that at least a portion of the first conductive-type high concentra-tion diffusion region is exposed on the side wall of the first trench between the gate electrode forming step and the second trench forming step.

[8] In the method of manufacturing a semiconductor device according to the present invention, it is preferable that, the method further include: a second conductive-type high concentration diffusion region forming step of forming a second conductive-type high concentration diffusion region in a predetermined region of a surface of the base region between the gate electrode forming step and the second trench forming step; and a second insulation film etching back step where the second insulation film in a region where the first trench is not formed as viewed in a plan view is removed by etching back between the shield electrode forming step and the source electrode forming step, wherein in the source electrode forming step, the source electrode be formed such that the source electrode is directly connected to the shield electrode, the first conductive-type high concentration diffusion region and the second conductive-type high concentration diffusion region.

[9] In the method of manufacturing a semiconductor device according to the present invention, it is preferable that, the method further include: an opening forming step of forming a predetermined opening in the second insulation film; and a metal plug forming step of forming a metal plug by filling the inside of the opening with metal between the shield electrode forming step and the source electrode forming step, wherein in the source electrode forming step, the source electrode be formed such that the source electrode is directly connected to the shield electrode and is connected to the first conductive-type high concentration diffusion region and the base region through the metal plug.

[10] In the method of manufacturing a semiconductor device according to the present invention, it is preferable that, the method further include: an opening forming step of forming a predetermined opening in the second insulation film; and a shield electrode connecting metal plug-metal plug forming step of forming a shield electrode connecting metal plug by filling the second gap with metal and forming a metal plug by filling the inside of the opening with metal between the shield electrode etching back step and the source electrode forming step, wherein in the source electrode forming step, the source electrode be formed such that the source electrode is connected to the shield electrode through the shield electrode connecting metal plug and is connected to the first conductive-type high concentration diffusion region and the base region through the metal plug.

[11] In the method of manufacturing a semiconductor device according to the present invention, it is preferable that, in the second insulation film forming step, the second insulation film be formed such that a thickness of the second insulation film is larger than a thickness of the gate insulation film.

[12] In the method of manufacturing a semiconductor device according to the present invention, in the second insulation film forming step, assuming a thickness of the second insulation film between a bottom of the first gap and a bottom of the first trench as D1, a thickness of the first insulation film between a side wall of the first gap at a depth position of the bottom of the first gap and a side wall of the first trench as d, and a thickness of the second insulation film between the side wall of the first gap at the depth position of the bottom of the first gap and the side wall of the first trench as D2, the second insulation film be formed such that a relationship of D1≤d+D2 is satisfied.

[13] A semiconductor device according to the present invention is a semiconductor device which includes a shield gate structure of an in-plane direction separation type where a gate electrode and a shield electrode are separated from each other in an in-plane direction, the semiconductor device including: a semiconductor base body having a first conductive-type first semiconductor layer and a first conductive-type second semiconductor layer having lower concentration than the first semiconductor layer; a predetermined trench formed on the second semiconductor layer; the gate electrode made of polysilicon and formed on a side wall of an upper portion of the trench with a gate insulation film interposed between the gate electrode and the side wall; the shield electrode formed on the center portion of the trench in a state where the shield electrode is spaced apart from the gate electrode; an insulation region configured to expand between the gate electrode and the shield electrode in the inside of the trench so as to make the shield electrode spaced apart from the gate electrode, and configured to expand along side walls and a bottom of the trench so as to make the shield electrode spaced apart from the side walls and the bottom of the trench; a protective insulation film formed on at least the gate electrode; and a source electrode electrically connected to the shield electrode, the source electrode disposed above the shield electrode directly and disposed on at least the gate electrode with the protective insulation film interposed therebetween, and, wherein a recessed portion defined by an upper surface of the shield electrode and the insulation region is formed on the shield electrode, the source electrode is electrically connected to the shield electrode directly or through the shield electrode connecting metal plug in the recessed portion.

Advantageous Effects of Invention

According to the method of manufacturing a semiconductor device of the present invention, the method includes the shield electrode forming step as a step which comes after the gate electrode forming step and hence, the insulation films (for example, the gate insulation film and the protective insulation film) are not formed above the shield electrode by a step which comes before the source electrode forming step. Accordingly, an insulation film removing step of removing the insulation films for establishing the connection between the shield electrode and the source electrode becomes unnecessary and hence, a step of establishing the connection between the shield electrode and the source electrode can be simplified.

According to the method of manufacturing a semiconductor device of the present invention, the source electrode is formed after forming the second gap in the upper portion of the first gap by removing a portion of the shield electrode by etching back. With such a configuration, a state is brought about where the source electrode and the shield electrode are electrically connected to each other in a state where an anchor effect is acquired between the source electrode and the shield electrode. Accordingly, a slippage of the source electrode in a horizontal direction minimally occurs also during a period of actual use (high and low temperature cycle) of the semiconductor device thus enhancing stability of the electrode connection during a period of actual use (high and low temperature cycle) of the semiconductor device.

According to the method of manufacturing a semiconductor device of the present invention, the second trench is formed in the inside of the first trench by removing the center portion of the first insulation film by etching and, thereafter, the second insulation film is formed in the inside of the second trench under the condition that the second gap remains in the inside of the second trench. Accordingly, a thickness of the insulation film (second insulation film) on a shield electrode bottom portion side and thicknesses of the insulation films (the first insulation film and the second insulation film) on a shield electrode side portion side can be easily set to desired thicknesses. As a result, the semiconductor device can be manufactured at a high degree of freedom in designing the semiconductor device.

According to the semiconductor device of the present invention, the recessed portion defined by the upper surface of the shield electrode and the insulation region is formed on the shield electrode, and the source electrode is electrically connected to the shield electrode directly or through the shield electrode connecting metal plug in the recessed portion. With such a configuration, a state is brought about where the source electrode and the shield electrode are electrically connected to each other in a state where an anchor effect is acquired between the source electrode and the shield electrode. Accordingly, even during a period of actual use (high and low temperature cycle) of the semiconductor device where a slippage in a horizontal direction is liable to occur in the source electrode, such a slippage minimally occurs and hence, stability of the electrode connection during a period of actual use (high and low temperature cycle) of the semiconductor device can be enhanced.

BRIEF DESCRIPTION OF DRAWINGS

FIG. 1A and FIG. 1B are views for describing a semiconductor device 100 of an embodiment 1, wherein FIG. 1A is an enlarged cross-sectional view (hereinafter simply referred to as a cross-sectional view) of an essential part of the semiconductor device 100 and FIG. 1B is an enlarged plan view (hereinafter simply referred to as a plan view) of the essential part of the semiconductor device 100 (symbol 122 indicating a groove (recessed portion) corresponding to a first gap 122 described later in FIG. 1A and FIG. 1B, and a source electrode 136, a source region 130 and a contact region 132 are not shown in FIG. 1B for the sake of brevity of explanation);

FIG. 7A to FIG. 7D are cross-sectional views for describing respective steps of a method of manufacturing a semiconductor device of the embodiment 2, wherein FIG. 7A is a view showing the same step as the step shown in FIG. 5B;

FIG. 9A to FIG. 9D are cross-sectional views for describing respective steps of a method of manufacturing a semiconductor device of the embodiment 3, wherein FIG. 9A is a view showing the same step as the step shown in FIG. 5B;

FIG. 11A to FIG. 11D are cross-sectional views for describing respective steps of a method of manufacturing a semiconductor device of the embodiment 4, wherein FIG. 11A is a view showing the same step as the step shown in FIG. 5B;

DESCRIPTION OF EMBODIMENTS

Figure 1A:
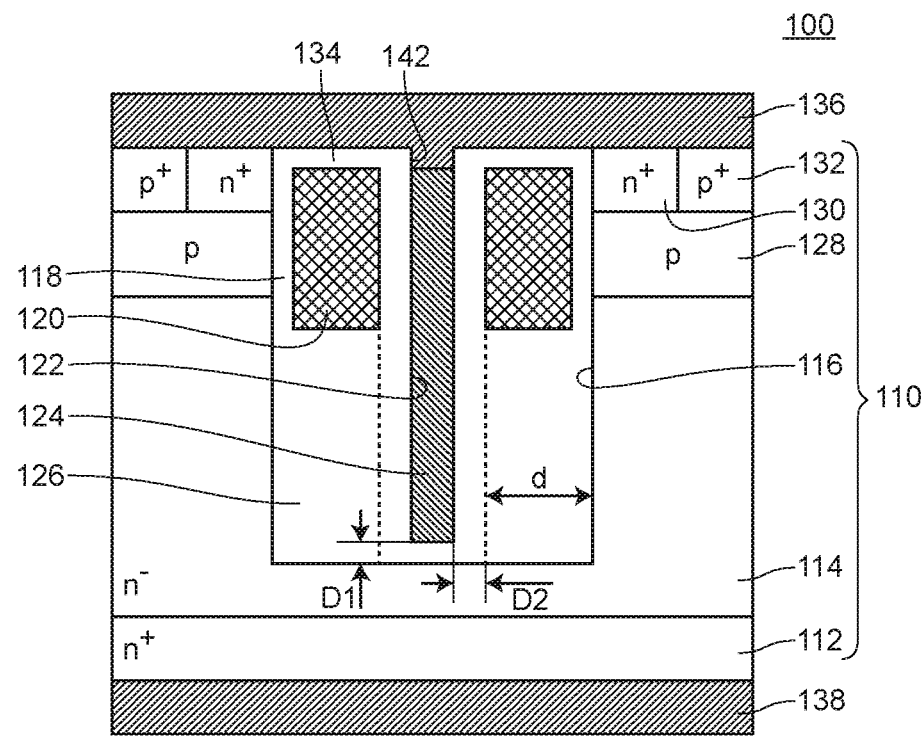

Hereinafter, a method of manufacturing a semiconductor device and a semiconductor device according to the present invention are described in accordance with embodiments shown in the drawings. The respective drawings are schematic views and hence, the drawings do not always strictly reflect actual sizes.

Embodiment 1

1. Configuration of Semiconductor Device 100 According to Embodiment 1

The semiconductor device 100 of the embodiment 1 is a power MOSFET having a shield gate structure of an in-plane direction separation type where a gate electrode and a shield electrode are separated from each other in an in-plane direction.

Figure 1B:
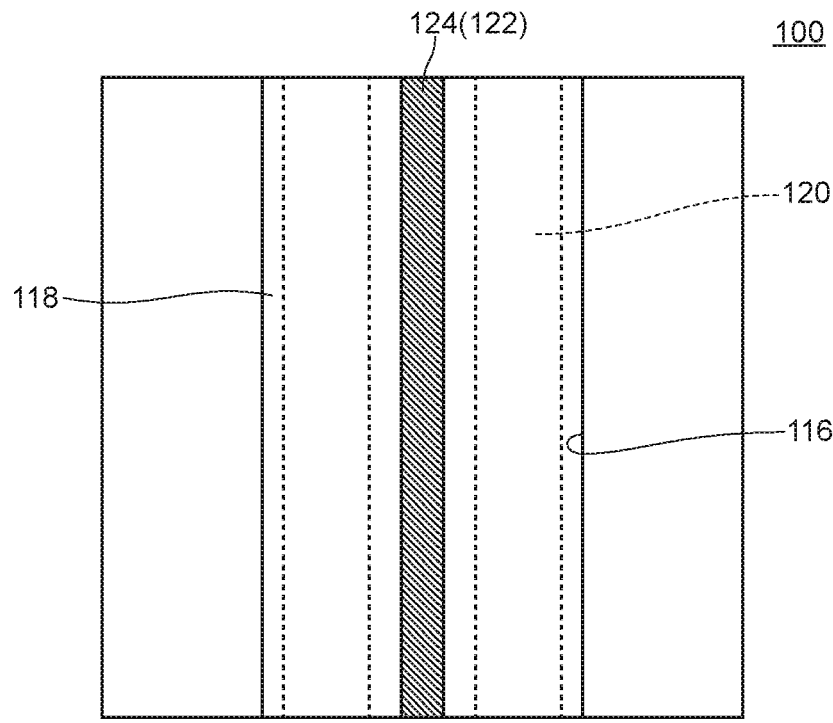

As shown in FIG. 1A and FIG. 1B, the semiconductor device 100 of the embodiment 1 includes: a semiconductor base body 110 having an n$^+$-type first semiconductor layer 112 and an n$^-$-type second semiconductor layer 114 having lower concentration than the n$^+$-type first semiconductor layer 112; a predetermined trench 116 (first trench) positioned on a surface of the second semiconductor layer 114; a gate electrode 120 made of polysilicon and formed on a side wall of an upper portion of the trench 116 with a gate insulation film 118 interposed between the gate electrode 120 and the side wall; a shield electrode 124 formed on the center portion of the trench 116 in a state where the shield electrode 124 is spaced apart from the gate electrode 120; an insulation region 126 configured to expand between the gate electrode 120 and the shield electrode 124 in the inside of the trench 116 so as to make the shield electrode 124 spaced apart from the gate electrode 120, and configured to expand along side walls and a bottom of the trench 116 so as to make the shield electrode 124 spaced apart from the side walls and the bottom of the trench 116; a base region 128 formed on a surface of the second semiconductor layer 114 in a region where the trench 116 is not formed as viewed in a plan view, a source region 130 (first conductive-type high concentration diffusion region) having a portion thereof exposed to the side wall of the trench 116 and formed on the surface of the base region 128; a p$^+$-type contact region 132 (second conductive-type high concentration diffusion region) formed on a predetermined region of a surface of the based region 128 (a region where the source region 130 is not formed); a protective insulation film 134 formed on the gate electrode 120; a source electrode 136 directly disposed on a surface of the shield electrode 124, disposed on a surface of the gate electrode 120 with the protective insulation film 134 interposed therebetween, and directly connected to the shield electrode 124, the source region 130 and the contact region 132; and a drain electrode 138 formed on a surface of the first semiconductor layer 112.

A recessed portion 142 which is defined by an upper surface of the shield electrode 124 and the insulation region 126 is formed above the shield electrode 124. The source electrode 136 is directly electrically connected to the shield electrode 124 in the recessed portion 142.

In the semiconductor device 100 of the embodiment 1, a thickness of the insulation region 126 interposed between the gate electrode 120 and the shield electrode 124 is set larger than a thickness of the gate insulation film 118.

In the semiconductor device 100 of the embodiment 1, assuming a thickness of the insulation region 126 between a bottom of the shield electrode 124 and a bottom of the trench 116 as D1, and a thickness of the insulation region 126 between a side wall of the shield electrode 124 at a depth position of the bottom of the shield electrode 124 and a side wall of the trench 116 (a total depth of a thickness of a first insulation film 126a described later and a thickness of a second insulation film 126b described later) as d+D2, a relationship of D1≤d+D2 is satisfied.

In the embodiment 1, all of the trench 116, the gate electrode 120, the base region 128, the source region 130 and the contact region 132 are formed in a stripe shape (see FIG. 1B).

A thickness of the first semiconductor layer 112 is set to a value which falls within a range of from 50 μm to 500 μm (for example, 350 μm), and dopant concentration of the first semiconductor layer 112 is set to a value which falls within a range of from 1×10$^{18}$ cm$^{-3}$ to 1×10$^{21}$ cm$^{-3}$ (for example, 1×10$^{19}$ cm$^{-3}$). A thickness of the second semiconductor layer 114 in a region where the trench 116 is not formed is set to a value which falls within a range of from 3 μm to 50 μm (for example, 15 μm), and dopant concentration of the second semiconductor layer 114 is set to a value which falls within a range of from 1×10$^{14}$ cm$^{-3}$ to 1×10$^{19}$ cm$^{-3}$ (for example, 1×10$^{15}$ cm$^{-3}$). A thickness of the base region 128 is set to a value which falls within a range of from 0.5 μm to 10 μm (for example, 5 μm), and dopant concentration of the base region 128 is set to a value which falls within a range of from 1×10$^{16}$ cm$^{-3}$ to 1×10$^{19}$ cm$^{-3}$ (for example, 1×10$^{17}$ cm$^{-3}$).

A depth of the trench 116 is set to a value which falls within a range of from 1 μm to 20 μm (for example, 10 μm), a pitch of the trenches 116 is set to a value which falls within a range of from 3 μm to 20 μm (for example, 10 μm), and an opening width of the trench 116 is set to a value which falls within a range of from 0.3 μm to 19 μm (for example, 7 μm). The gate insulation film 118 is formed of a silicon dioxide film which is formed by, for example, a thermal oxidation method, and a thickness of the gate insulation film 118 is set to a value which falls within a range of from 20 nm to 200 nm (for example, 100 nm). The gate electrode 120 is made of polysilicon of low resistance formed by a CVD method, for example, and a thickness of the gate electrode 120 is set to a value which falls within a range of from 0.1 μm to 5 μm (for example, 2 μm).

A distance between the shield electrode 124 and the gate electrode 120 is set to a value which falls within a range of from 0.02 μm to 3 μm (for example, 1 μm), and a distance between the shield electrode 124 and a bottom of the trench 116 is set to a value which falls within a range of from 0.1 μm to 3 μm (for example, 2 μm), and a distance between the shield electrode 124 and a side wall of the trench 116 at a depth position of the bottom of the shield electrode 124 is set to a value which falls within a range of from 0.1 μm to 8 μm (for example, 3 μm).

A depth of the source region 130 is set to a value which falls within a range of from 1 μm to 3 μm (for example, 2 μm), and dopant concentration of the source region 130 is set to a value which falls within a range of from $1\times10^{18}$ cm$^{-3}$ to $1\times10^{23}$ cm$^{-3}$ (for example, $2\times10^{19}$ cm$^{-3}$). A depth of the contact region 132 is set to a value which falls within a range of from 1 μm to 3 μm (for example, 2 μm), and dopant concentration of the contact region 132 is set to a value which falls within a range of from $1\times10^{18}$ cm$^{-3}$ to $1\times10^{20}$ cm$^{-3}$ (for example, $2\times10^{19}$ cm$^{-3}$). The protective insulation film 134 is, for example, formed of a silicon dioxide film which is formed by a CVD method, and a thickness of the protective insulation film 134 is set to a value which falls within a range of from 0.5 μm to 3 μm (for example, 1 μm).

The source electrode 136 is formed of, for example, an Al film or an Al alloy film (for example, AlSi film), and a thickness of the source electrode 136 is set to a value which falls within a range of from 1 μm to 10 μm (for example, 3 μm). The drain electrode 138 is formed of a stacked film formed by stacking a Ti layer, an Ni layer and an Au layer in this order, and a thickness of the drain electrode 138 is set to a value which falls within a range of from 0.2 μm to 1.5 μm (for example, 1 μm).

2. Advantageous Effects Acquired by Semiconductor Device 100 According to Embodiment 1

According to the semiconductor device 100 of the embodiment 1, the recessed portion 142 defined by the upper surface of the shield electrode 124 and the insulation region 126 is formed on the shield electrode 124, and the source electrode 136 is directly electrically connected to the shield electrode 124 in the recessed portion 142. With such a configuration, a state is brought about where the source electrode 136 and the shield electrode 124 are electrically connected to each other in a state where an anchor effect is acquired between the source electrode 136 and the shield electrode 124. Accordingly, even during a period of actual use (high and low temperature cycle) of the semiconductor device where a slippage in a horizontal direction is liable to occur in the source electrode, such a slippage minimally occurs and hence, stability of the electrode connection during a period of actual use (high and low temperature cycle) of the semiconductor device can be enhanced.

3. Method of Manufacturing Semiconductor Device of Embodiment 1

The semiconductor device 100 of this embodiment 1 can be manufactured by a manufacturing method having the following manufacturing steps (the method of manufacturing a semiconductor device of the embodiment 1).

(1) Semiconductor Base Body Preparing Step

Figure 2A:
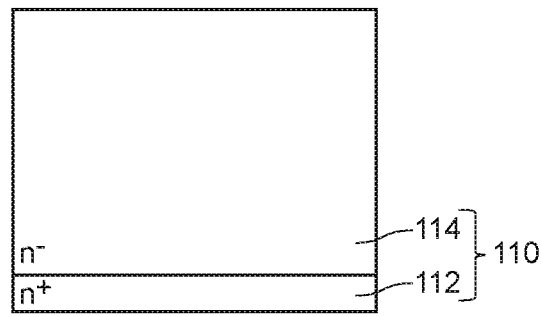
FIG. 2A to FIG. 2D are cross-sectional views for describing respective steps of a method of manufacturing a semiconductor device of the embodiment 1.

First, a semiconductor base body 110 having an n$^+$-type first semiconductor layer 112 and an n$^-$-type second semiconductor layer 114 having lower concentration than the first semiconductor layer 112 is prepared (see FIG. 2A). A suitable semiconductor base body can be used as the semiconductor base body 110. For example, a semiconductor base body can be used where an n$^-$-type second semiconductor layer 114 is formed on an n$^+$-type first semiconductor layer 112 by an epitaxial growth method. Although a semiconductor base body made of silicon is used as the semiconductor base body 110 in the embodiment 1, a semiconductor base body made of a material other than silicon may be used as the semiconductor base body 110.

(2) First Trench Forming Step

Figure 2B:
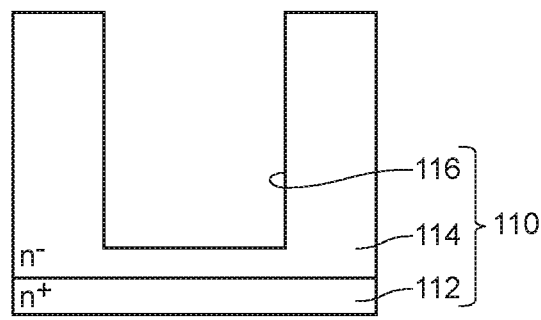

Next, a predetermined first trench 116 is formed on the second semiconductor layer 114 in such a manner that a mask having a predetermined opening (not shown in the drawing) is formed on a surface of the second semiconductor layer 114, and the predetermined first trench 116 is formed by etching the second semiconductor layer 114 using the mask (see FIG. 2B).

(3) First Insulation Film Forming Step

Figure 2C:
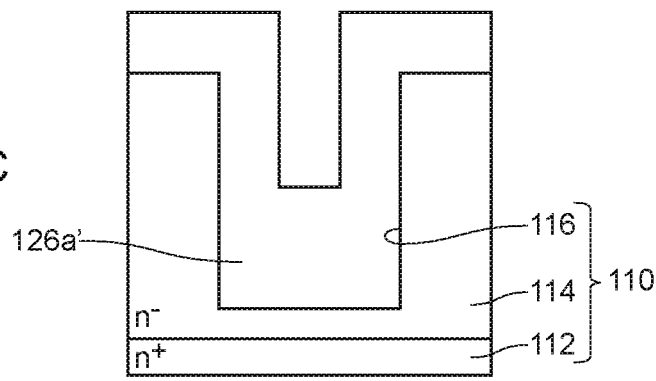
Figure 2D:
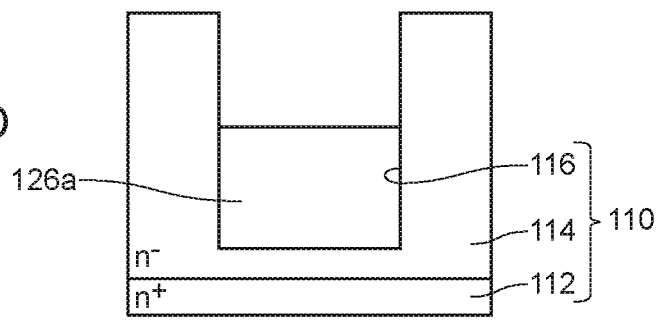

Next, a silicon oxide film 126a' having a predetermined thickness is formed on a surface of the second semiconductor layer 114 (including the inside of the first trench 116) by a CVD method (see FIG. 2C). A thickness of the silicon oxide film 126a' is set to a value which falls within a range of from 0.5 μm to 5 μm, for example. Next, a first insulation film 126a is formed such that the silicon oxide film 126a' on portions of the first trench 116 other than the lower portion of the first trench 116 is removed by etching back so that the first insulation film 126a is formed so as to be filled in a lower portion of the first trench 116 (see FIG. 2D).

(4) Gate Insulation Film Forming Step

Figure 3A:
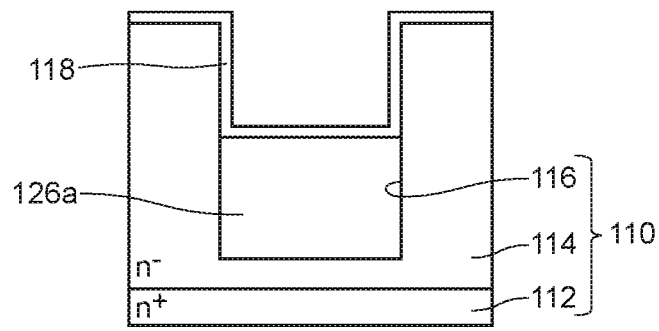
FIG. 3A to FIG. 3D are cross-sectional views for describing respective steps of the method of manufacturing a semiconductor device of the embodiment 1.

Next, a silicon oxide film is formed on surfaces of the first insulation film 126a and the second semiconductor layer 114 (including the surfaces of the side walls of the upper portion of the first trench 116) by a thermal oxidation method (see FIG. 3A). The silicon oxide film formed on the side walls of the upper portion of the first trench 116 forms the gate insulation film 118. A thickness of the gate insulation film 118 is set to a value which falls within a range of from 20 nm to 200 nm, for example.

(5) Gate Electrode Forming Step

Figure 3B:
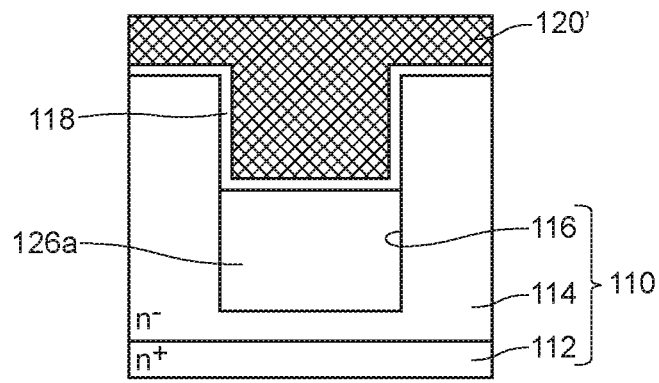
Figure 3C:
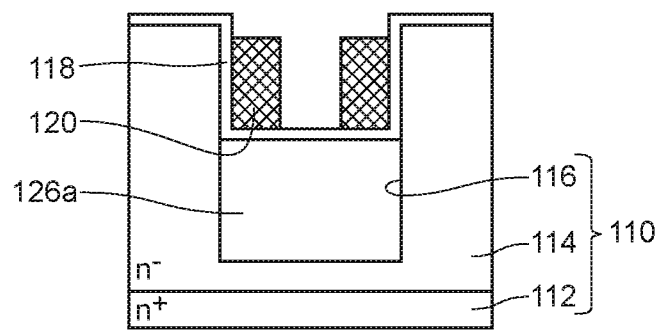

Next, a polysilicon layer 120' is formed on a surface of the silicon oxide film by a CVD method (see FIG. 3B). Then, gate electrodes 120 made of polysilicon are formed by etching back the polysilicon layer 120' (see FIG. 3C). In the gate electrode layer forming step, the polysilicon layer 120' is etched back such that the gate electrodes 120 are formed at positions spaced apart from each other with a predetermined distance therebetween in the inside of the first trench 116.

(6) Steps of Forming Base Regions 128, Source Regions 130 and Contact Regions 132

Figure 3D:
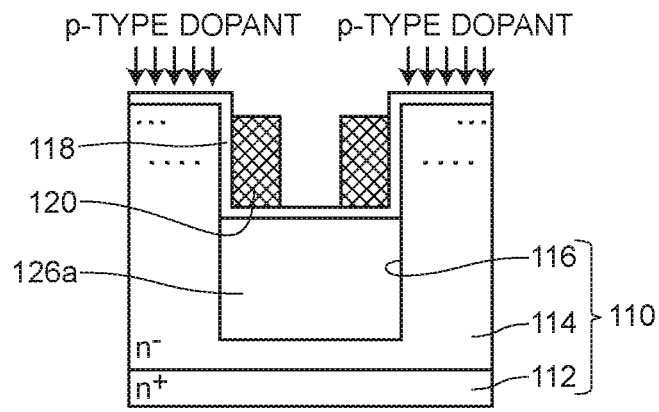
Figure 4A:
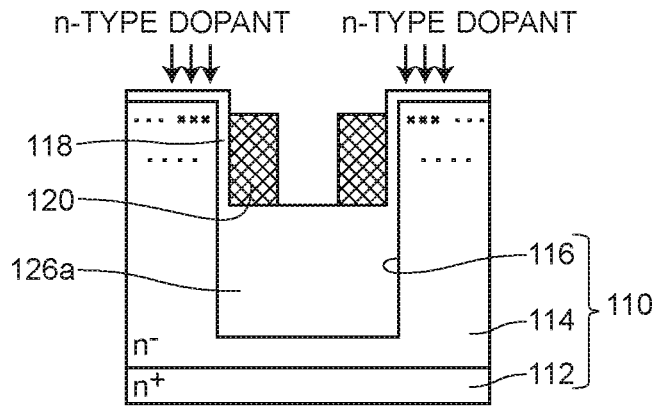
FIG. 4A to FIG. 4D are cross-sectional views for describing respective steps of the method of manufacturing a semiconductor device of the embodiment 1.
Figure 4B:
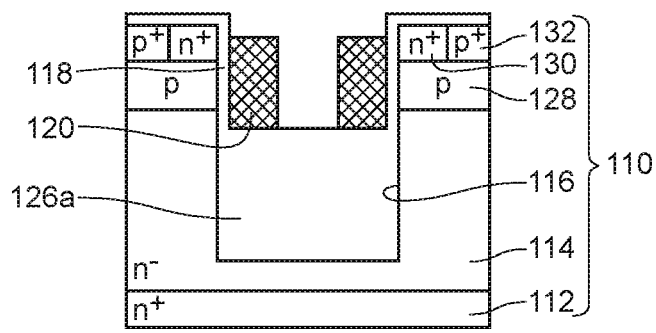

Next, p-type dopant (for example, boron) is injected by ion implantation into a surface of the second semiconductor layer 114 in regions where the first trench 116 is not formed as viewed in a plan view. Then, a mask having openings corresponding to contact regions 132 (not shown in the drawing) is formed on the second semiconductor layer 114, and a p-type dopant (for example, boron) is injected by ion implantation into a shallower depth position with higher dopant concentration by means of the mask (see FIG. 3D). Next, a mask having openings corresponding to source regions 130 (not shown in the drawing) is formed on the surface of the second semiconductor layer 114, and an n-type dopant (for example, phosphorus) is injected by ion implantation into the surface of the second semiconductor layer 114 by means of the mask (see FIG. 4A). Then, by thermally diffusing the p-type dopant and the n-type dopant injected into the second semiconductor layer 114 by ion implantation, the base regions 128, the source regions 130 and the contact regions 132 are formed (see FIG. 4B).

(7) Second Trench Forming Step

Figure 4C:
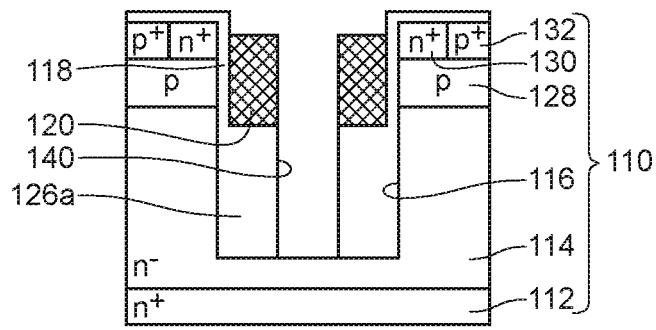

Next, a mask having an opening at a center portion of the first insulation film 126a (not shown in the drawing) is formed, and a second trench 140 is formed in the first trench 116 by removing the center portion of the first insulation film 126a by etching using the mask such that the second trench 140 reaches the bottom of the first trench 116 (see FIG. 4C). An opening width of the second trench 140 is equal to a distance between two gate electrodes 120 in the first trench 116 and, for example, the opening width is set to a value which falls within a range of from 0.1 μm to 5 μm.

(8) Second Insulation Film Forming Step

Figure 4D:
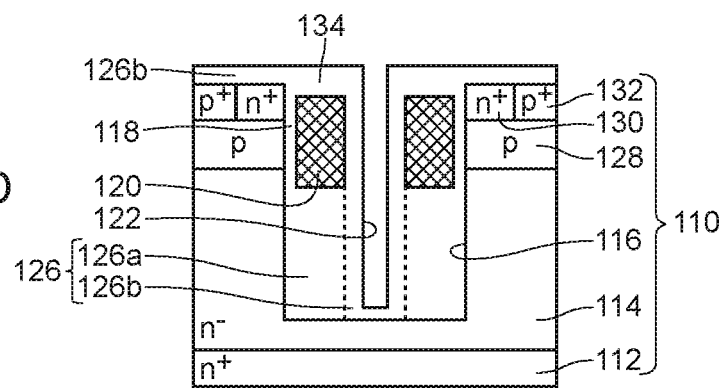

Next, a second insulation film 126b is formed by a thermal oxidation method in the second trench 140 under a condition that a first gap 122 remains in the second trench 140 (see FIG. 4D). In this step, the second insulation film 126b is also formed on the region of the second semiconductor layer 114 where the first trench 116 is not formed and a surface of the gate electrode 120. The first insulation film 126a and the second insulation film 126b form an insulation region 126, and the second insulation film 126b on the gate electrode 120 forms a protective insulation film 134.

In the second insulation film forming step, the second insulation film 126b is formed such that a thickness of the second insulation film 126b is larger than a thickness of the gate insulation film 118. The thickness of the second insulation film 126b is set to a value which falls within a range of from 0.2 μm to 5 μm. A depth of the first gap 122 is set to a value which falls within a range of from 0.5 μm to 19 μm, and an opening width of the first gap 122 is set to a value which falls within a range of from 0.1 μm to 5 μm.

In the second insulation film forming step, assuming a thickness of the second insulation film 126b between a bottom of the first gap 122 and a bottom of the first trench 116 as D1, a thickness of the first insulation film 126a between a side wall of the first gap 122 at a depth position of the bottom of the first gap 122 and a side wall of the first trench 116 as d, and a thickness of the second insulation film 126b between the side wall of the first gap 122 at the depth position of the bottom of the first gap 122 and the side wall of the first trench 116 as D2, the second insulation film 126b is formed such that a relationship of D1<d+D2 is satisfied (see FIG. 1A and FIG. 1B).

(9) Shield Electrode Forming Step

Figure 5A:
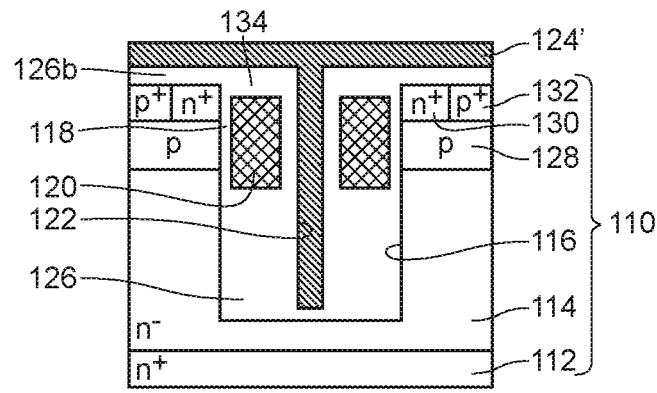
FIG. 5A to FIG. 5D are cross-sectional views for describing respective steps of the method of manufacturing a semiconductor device of the embodiment 1.

Next, a polysilicon layer 124' is formed on the whole region of the surface of the semiconductor base body 110 on a second semiconductor layer 114 side (see FIG. 5A).

(10) Shield Electrode Etching Back Step

Figure 5B:
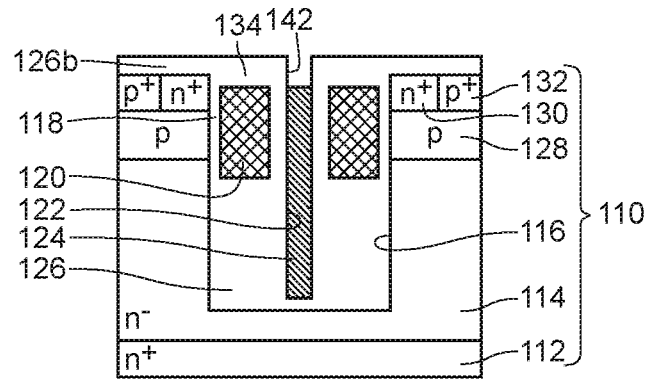

Next, a second gap 142 (recessed portion 142) is formed in an upper portion of the first gap 122 by removing the polysilicon layer 124' by etching back until the second gap 142 reaches a depth position deeper than a surface of the second semiconductor layer 114 (see FIG. 5B). The polysilicon layer 124' remaining in the inside of the first gap 122 forms a shield electrode 124.

Figure 5C:
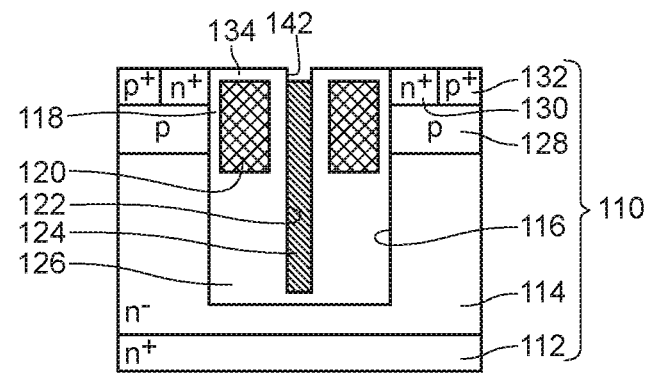

Next, the second insulation film 126b in the region where the first trench 116 is not formed as viewed in a plan view is removed by etching back until etching reaches a depth position of a surface of the second semiconductor layer 114 (see FIG. 5C). In this step, the protective insulation film 134 on the gate electrode 120 is also removed until etching reaches a depth position of surface of the second semiconductor layer 114.

(11) Source Electrode and Drain Electrode Forming Step

Figure 5D:
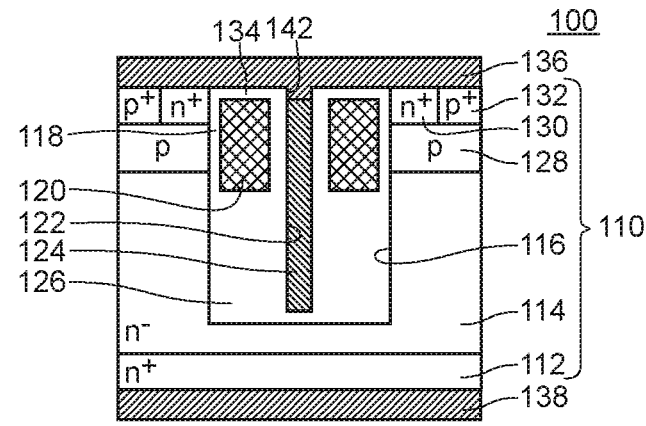

Next, a source electrode 136 is formed on surfaces of the source regions 130, the contact regions 132, the shield electrode 124 and the protective insulation films 134 such that the source electrode 136 is directly connected to the shield electrode 124, the source regions 130 and the contact regions 132 (see FIG. 5D). In this step, metal which forms a source electrode enters also the inside of the second gap 142 so that the source electrode 136 is formed so as to make the shield electrode 124 and the source electrode 136 directly connected to each other. A drain electrode 138 is formed on a surface of the first semiconductor layer 112.

The semiconductor device 100 of the embodiment 1 can be manufactured in accordance with the above-mentioned steps.

4. Advantageous Effects Acquired by Method of Manufacturing a Semiconductor Device of Embodiment 1

According to the method of manufacturing a semiconductor device of the embodiment 1, the method includes the shield electrode forming step as a step which comes after the gate electrode forming step and hence, the insulation films (for example, the gate insulation film and the protective insulation film) are not formed above the shield electrode 124 by a step which comes before the source electrode forming step. Accordingly, an insulation film removing step of removing the insulation films to establish the connection between the shield electrode 124 and the source electrode 136 becomes unnecessary and hence, a step of establishing the connection between the shield electrode 124 and the source electrode 136 can be simplified.

According to the method of manufacturing a semiconductor device of the embodiment 1, the source electrode 136 is formed after forming the second gap 142 in the upper portion of the first gap 122 by removing a portion of the shield electrode 124 by etching back. With such a configuration, a state is brought about where the source electrode 136 and the shield electrode 124 are electrically connected to each other in a state where an anchor effect is acquired between the source electrode 136 and the shield electrode 124. Accordingly, a slippage of the source electrode in a horizontal direction minimally occurs also during a period of actual use (high and low temperature cycle) of the semiconductor device where a slippage in a horizontal direction is liable to occur on the source electrode 136 thus enhancing stability of the electrode connection during a period of actual use (high and low temperature cycle) of the semiconductor device.

According to the method of manufacturing a semiconductor device of the embodiment 1, the second trench 140 is formed in the inside of the first trench 116 by removing the center portion of the first insulation film 126a by etching and, thereafter, the second insulation film 126b is formed in the inside of the second trench 140 under the condition that the first gap 122 remain in the inside of the second trench 140. Accordingly, a thickness of the insulation film (second insulation film 126b) on a shield electrode bottom portion side and thicknesses of the insulation films (the first insulation film 126a and the second insulation film 126b) on a shield electrode side portion side can be easily set to desired thicknesses. As a result, the semiconductor device can be manufactured with a high degree of freedom in designing the semiconductor device.

It is considered in general that an oxide film formed by thermally oxidizing single crystal silicon and an oxide film formed by thermally oxidizing polysilicon differ from each other in film quality. That is, it is considered that a rate of $SiO_2$ is relatively high in an oxide film formed by thermally oxidizing single crystal silicon, while a rate of $SiO_x$ is also high besides $SiO_2$ in an oxide film formed by thermally oxidizing polysilicon. Accordingly, it is considered that irregularities are liable to occur in an oxide film formed by thermally oxidizing polysilicon of the gate electrode 120 (an oxide film between the gate electrode 120 and the shield electrode 124) and hence, irregularities are liable to occur in ESD breakdown resistance between the gate electrode 120 and the shield electrode 124.

However, according to the method of manufacturing a semiconductor device of the embodiment 1, as described above, the thickness of the insulation film on the shield electrode bottom portion side (second insulation film) and the thicknesses of the insulation films on the shield electrode side portion side (the first insulation film and the second insulation film) can be easily set to desired thicknesses and hence, it is possible to manufacture a semiconductor device with minor irregularities in ESD breakdown resistance.

According to the method of manufacturing a semiconductor device of the embodiment 1, in the shield electrode etching back step, the depth position of the upper surface of the shield electrode 124 when a surface of the second insulation film 126b formed on the gate electrode 120 is used as a reference is set to a value which falls within a range of from 0.01 µm to 2 µm. With such a configuration, a state is brought about where the source electrode 136 and the shield electrode 124 are electrically connected to each other in a state where a larger anchor effect is acquired between the source electrode 136 and the shield electrode 124. Accordingly, a slippage of the source electrode in a horizontal direction minimally occurs also during a period of actual use (high and low temperature cycle) of the semiconductor device where a slippage in a horizontal direction is liable to occur on the source electrode 136 thus further enhancing stability of the electrode connection during a period of actual use (high and low temperature cycle) of the semiconductor device.

According to the method of manufacturing a semiconductor device of the embodiment 1, in the source electrode forming step, metal which forms the source electrode 136 is filled in the inside of the second gap 142 for forming the source electrode 136 such that the source electrode 136 is directly connected to the shield electrode 124. With such a configuration, a state is brought about where the source electrode 136 and the shield electrode 124 are electrically connected to each other in a state where a larger anchor effect is acquired between the source electrode 136 and the shield electrode 124. Accordingly, a slippage of the source electrode in a horizontal direction minimally occurs also during a period of actual use (high and low temperature cycle) of the semiconductor device where a slippage in a horizontal direction is liable to occur on the source electrode 136 thus further enhancing stability of the electrode connection during a period of actual use (high and low temperature cycle) of the semiconductor device.

According to the method of manufacturing a semiconductor device of the embodiment 1, in the source electrode forming step, the source electrode 136 is formed such that the source electrode 136 is directly connected to the shield electrode 124, the source region 130 and the contact region 132. With such a configuration, a contact area between the source electrode 136 and the source region 130 and a contact area between the source region 130 and the contact region 132 can be increased and hence, contact resistance can be decreased.

According to the method of manufacturing a semiconductor device of the embodiment 1, in the second insulation film forming step, the second insulation film 126b is formed such that a thickness of the second insulation film 126b is larger than a thickness of the gate insulation film 118. Accordingly, a withstand voltage between the gate electrode and the shield electrode can be increased compared to the conventional semiconductor device 900.

According to the method of manufacturing a semiconductor device of the embodiment 1, in the second insulation film forming step, assuming a thickness of the second insulation film 126b between the bottom of the first gap 122 and the bottom of the first trench 116 as D1, a thickness of the first insulation film 126a between the side wall of the first gap 122 at the depth position of the bottom of the first gap 122 and a side wall of the first trench 116 as d, and a thickness of the second insulation film 126b between the side wall of the first gap 122 at the depth position of the bottom of the first gap 122 and the side wall of the first trench 116 as D2, the second insulation film 126b is formed such that a relationship of D1<d+D2 is satisfied.

By adopting such a method, it is possible to acquire the following advantageous effects.

(1) The shield electrode 124 can be formed such that the shield electrode 124 reaches a deep depth position and hence, it is possible to make a depletion layer reach a deep position when a reverse bias is applied. As a result, a source-drain withstand voltage can be increased.

(2) A distance from a corner portion of the first trench 116 where the concentration of an electric field is liable to occur to the gate electrode 120 can be increased and, further, an electric field can be alleviated by the first insulation film 126a and the second insulation film 126b. As a result, a withstand voltage can be increased also from this point of view.

Embodiment 2

Figure 6:
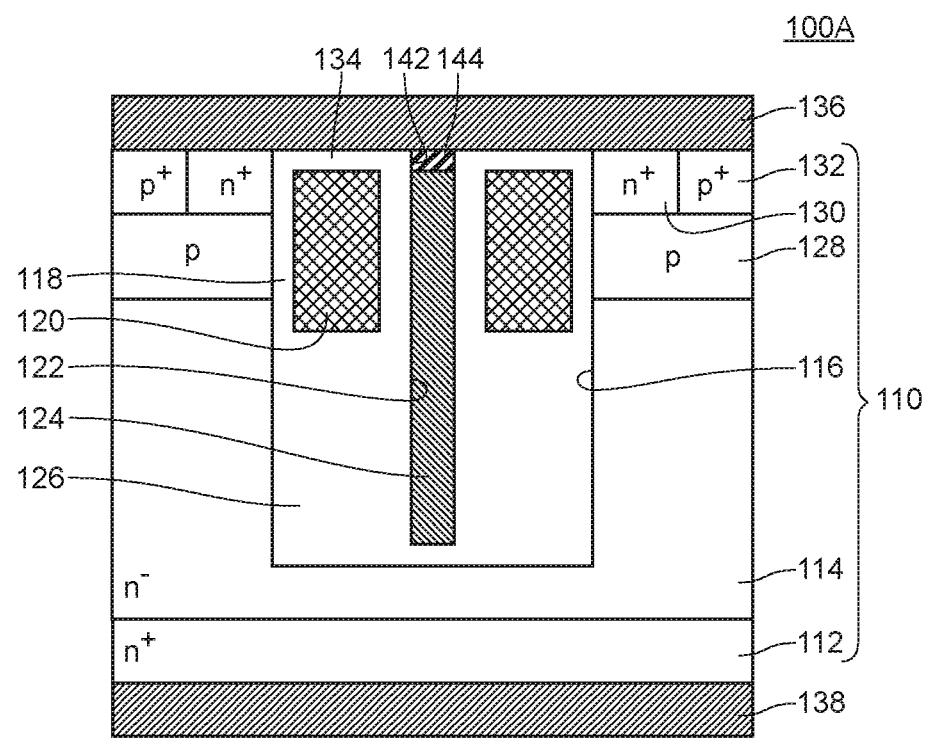
FIG. 6 is a cross-sectional view of a semiconductor device 100A of an embodiment 2.

A semiconductor device 100A of the embodiment 2 basically has substantially the same configuration as the semiconductor device 100 of the embodiment 1. However, the semiconductor device 100A of the embodiment 2 differs from the semiconductor device 100 of the embodiment 1 with respect to a point that a source electrode is connected to a shield electrode through a shield electrode connecting metal plug. That is, as shown in FIG. 6, the semiconductor device 100A of the embodiment 2 further includes a shield electrode connecting metal plug 144 formed by filling a second gap 142 with metal, and a source electrode 136 is connected to a shield electrode 124 through the shield electrode connecting metal plug 144.

The semiconductor device 100A of the embodiment 2 can be manufactured by a method of manufacturing a semiconductor device of the embodiment 2 described hereinafter.

Figure 7A:
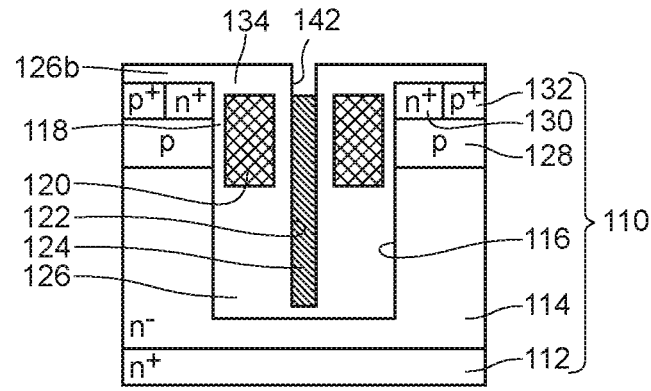
Figure 7B:
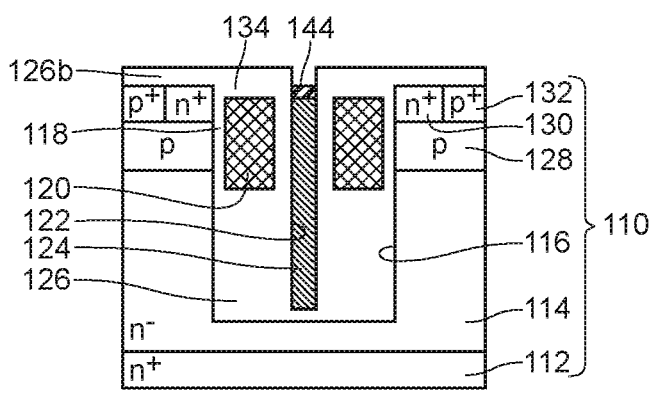

The method of manufacturing a semiconductor device of the embodiment 2 basically has substantially the same steps as the method of manufacturing a semiconductor device of the embodiment 1. However, the method of manufacturing a semiconductor device of the embodiment 2 differs from the method of manufacturing a semiconductor device of the embodiment 1 with respect to a point that the method of the embodiment 2 includes a shield electrode connecting metal plug forming step. That is, the method of manufacturing a semiconductor device of the embodiment 2 includes, between a shield electrode etching back step (see FIG. 5B) and a source electrode forming step (see FIG. 5D), a shield electrode connecting metal plug forming step (FIG. 7B) of forming the shield electrode connecting metal plug 144 by filling the second gap 142 with metal.

A barrier metal (not shown in the drawing) is formed on an inner surface of the second gap 142, and the shield electrode connecting metal plug 144 is formed such that the inside of the second gap 142 is filled with predetermined metal by way of the barrier metal. Predetermined metal is tungsten, for example.

Figure 7C:
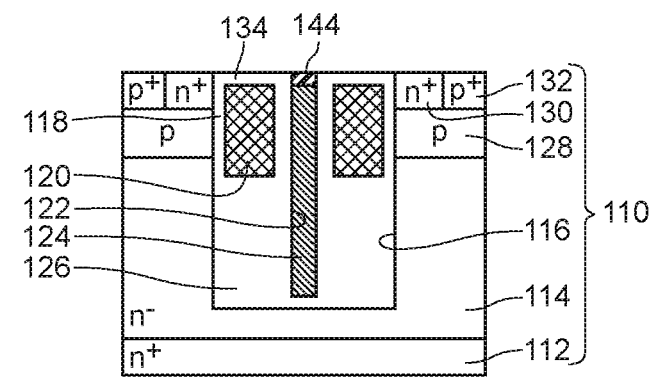
Figure 7D:
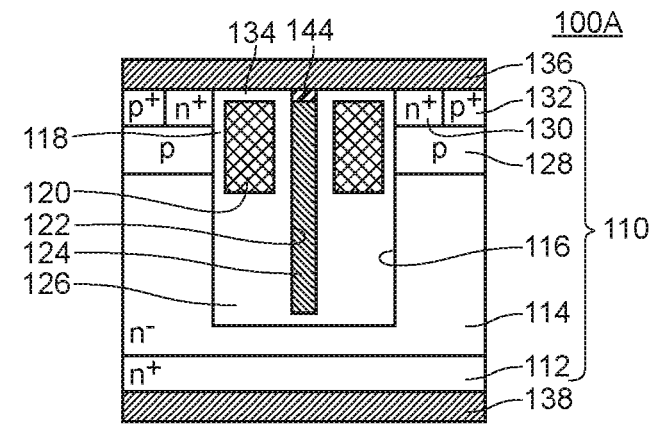

After the second insulation film forming step is finished (see FIG. 7C), the source electrode forming step is performed where a source electrode 136 is formed such that the source electrode is connected to the shield electrode 124 through the shield electrode connecting metal plug 144 (see FIG. 7D).

In this manner, the method of manufacturing a semiconductor device of the embodiment 2 differs from the method of manufacturing a semiconductor device of the embodiment 1 with respect to a point that the method of the embodiment 2 includes the shield electrode connecting metal plug forming step. However, in the same manner as the method of manufacturing a semiconductor device of the embodiment 1, the method of manufacturing a semiconductor device of the embodiment 2 includes the shield electrode forming step as a step which comes after the gate electrode forming step and hence, insulation films (a gate insulation film and a protective insulation film, for example) are not formed above the shield electrode 124 by a step which comes before the source electrode forming step. Accordingly, an insulation film removing step of removing the insulation films to establish the connection between the shield electrode 124 and the source electrode 136 becomes unnecessary and hence, a step of establishing the connection between the shield electrode 124 and the source electrode 136 can be simplified.

According to the method of manufacturing a semiconductor device of the embodiment 2, the method includes the shield electrode connecting metal plug forming step of forming the shield electrode connecting metal plug 144 by filling the inside of the second gap 142 with metal between the shield electrode etching back step and the source electrode forming step and hence, the shield electrode connecting metal plug 144 is formed in the inside of the second gap 142. In the source electrode forming step, the source electrode 136 is formed such that the source electrode 136 is connected to the shield electrode 124 through the shield electrode connecting metal plug 144. Accordingly, high adhesiveness is acquired between the source electrode 136 made of metal and the shield electrode connecting metal plug 144 made of metal and hence, the shield electrode connecting metal plug 144 plays a role of an anchor against a slippage of the source electrode 136 in the horizontal direction. Accordingly, a slippage of the source electrode 136 in a horizontal direction minimally occurs also during a period of actual use (high and low temperature cycle) of the semiconductor device where a slippage in a horizontal direction is liable to occur on the source electrode 136 thus enhancing stability of the electrode connection during a period of actual use (high and low temperature cycle) of the semiconductor device.

The method of manufacturing a semiconductor device of the embodiment 2 includes substantially the same steps as the method of manufacturing a semiconductor device of the embodiment 1 with respect to points other than the above-mentioned point that the method includes the shield electrode connecting metal plug forming step. Accordingly, the method of manufacturing a semiconductor device of the embodiment 2 acquires advantageous effects which correspond to advantageous effects out of advantageous effects which the method of manufacturing a semiconductor device of the embodiment 1 can acquire.

Embodiment 3

Figure 8:
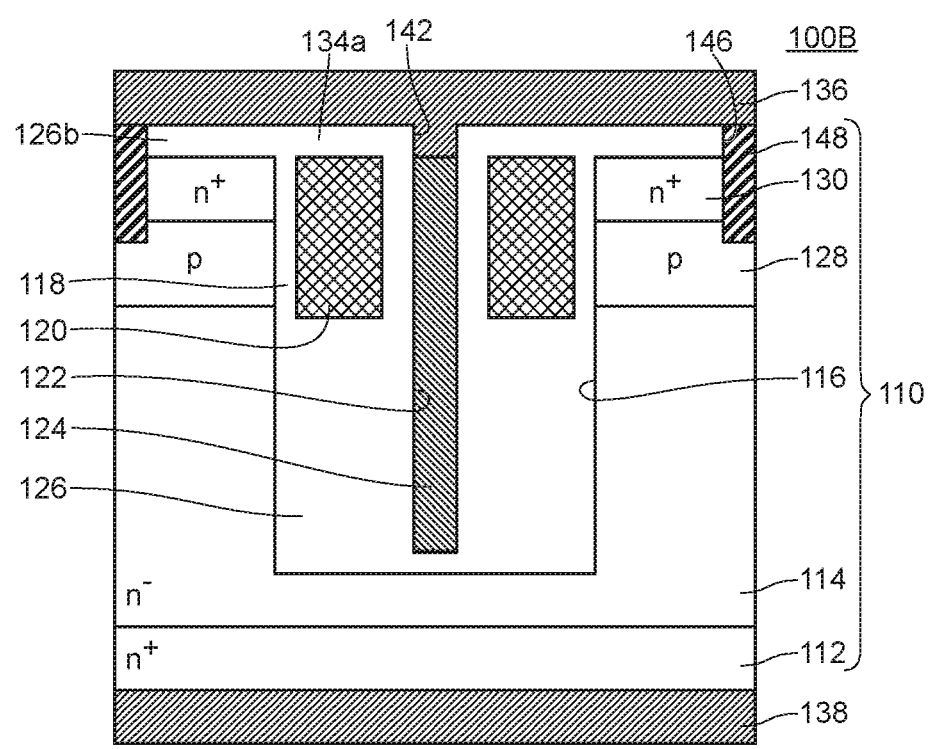
FIG. 8 is a cross-sectional view of a semiconductor device 100B of an embodiment 3.

A semiconductor device 100B of the embodiment 3 basically has substantially the same configuration as the semiconductor device 100 of the embodiment 1. However, the semiconductor device 100B of the embodiment 3 differs from the semiconductor device 100 of the embodiment 1 with respect to a point that a source electrode is connected to a source region through a metal plug. That is, in the semiconductor device 100B of the embodiment 3, as shown in FIG. 8, a second insulation film 126b is formed also between a source electrode 136 and a source region 130, a predetermined opening 146 is formed in the second insulation film 126b, and a metal plug 148 is formed by filling the inside of the opening 146 with metal.

The semiconductor device 100B of the embodiment 3 can be manufactured by a method of manufacturing a semiconductor device of the embodiment 3 described hereinafter.

The method of manufacturing a semiconductor device of the embodiment 3 basically has substantially the same steps as the method of manufacturing a semiconductor device of the embodiment 1. However, the method of manufacturing a semiconductor device of the embodiment 3 differs from the method of manufacturing a semiconductor device of the embodiment 1 with respect to a point that the method of the embodiment 3 includes a metal plug forming step. That is, the method of manufacturing a semiconductor device of the embodiment 3, as shown in FIG. 9A to FIG. 9D, further includes: an opening forming step where a predetermined opening 146 is formed in the second insulation film 126b (see FIG. 9B) and a metal plug forming step where a metal plug 148 is formed by filling the inside of the opening 146 with metal (see FIG. 9C) between a shield electrode forming step (see FIG. 5B) and a source electrode forming step (see FIG. 5D).

Then, after a second insulation film forming step is performed (see FIG. 9C), in the source electrode forming step, the source electrode 136 is formed such that the source electrode 136 is directly connected to the shield electrode 124 and is connected to the source region 130 and the base region 128 through the metal plug 148 (see FIG. 9D).

The openings 146 and metal plugs 148 are formed in a stripe shape, and a stripe width is set to 0.5 μm, for example. A barrier metal (not shown in the drawing) is formed on an inner surface of the opening 146, and the metal plug 148 is formed such that the inside of the opening 146 is filled with predetermined metal by way of the barrier metal. Predetermined metal is tungsten, for example.

In this manner, the method of manufacturing a semiconductor device of the embodiment 3 differs from the method of manufacturing a semiconductor device of the embodiment 1 with respect to a point that the method of the embodiment 3 includes the metal plug forming step. However, in the same manner as the method of manufacturing a semiconductor device of the embodiment 1, the method of manufacturing a semiconductor device of the embodiment 3 includes the shield electrode forming step as a step which comes after the gate electrode forming step and hence, the insulation films are not formed above the shield electrode 124 by a step which comes before the source electrode forming step. Accordingly, an insulation film removing step of removing the insulation films becomes unnecessary and hence, a step of establishing the connection between the shield electrode 124 and the source electrode 136 can be simplified.

In the method of manufacturing a semiconductor device of the embodiment 3, the method further includes: the opening forming step of forming the predetermined opening 146 in the second insulation film 126b; and the metal plug forming step of forming the metal plug 148 by filling the inside of the opening 146 with metal and hence, the metal plug 148 is formed in the inside of the opening 146. In the source electrode forming step, the source electrode 136 is formed such that the source electrode 136 is directly connected to the shield electrode 124 and is connected to the source region 130 and the base region 128 through the metal plug 148. Accordingly, high adhesiveness is acquired between the source electrode 136 made of metal and the metal plug 148 made of metal and hence, the metal plug 148 plays a role of an anchor against a slippage of the source electrode 136 in the horizontal direction. Accordingly, a slippage of the source electrode 136 in a horizontal direction minimally occurs also during a period of actual use (high and low temperature cycle) of the semiconductor device where a slippage of the source electrode 136 in a horizontal direction is liable to occur thus enhancing stability of the electrode connection during a period of actual use (high and low temperature cycle) of the semiconductor device.

In the method of manufacturing a semiconductor device of the embodiment 3, the source electrode 136 is formed such that the source electrode 136 is directly connected to the shield electrode 124 and is connected to the source region 130 and the base region 128 through the metal plug 148. Accordingly, unlike the case of a method of manufacturing a semiconductor device where a source electrode is formed such that the source electrode is directly connected to a source region, it is unnecessary to forma large opening by removing a large amount of protective insulation film and hence, it is possible to manufacture a miniaturized semiconductor device. As a result, the method of manufacturing a semiconductor device of the embodiment 3 can manufacture a semiconductor device which satisfies a demand for the reduction of cost in electronic equipment and downsizing of electronic equipment.

The method of manufacturing a semiconductor device of the embodiment 3 includes substantially the same steps as the method of manufacturing a semiconductor device of the embodiment 1 with respect to points other than the point that the method includes the metal plug forming step and hence, the method of manufacturing a semiconductor device of the embodiment 3 acquires advantageous effects which correspond to advantageous effects out of advantageous effects which the method of manufacturing a semiconductor device of the embodiment 1 can acquire.

Embodiment 4

Figure 10:
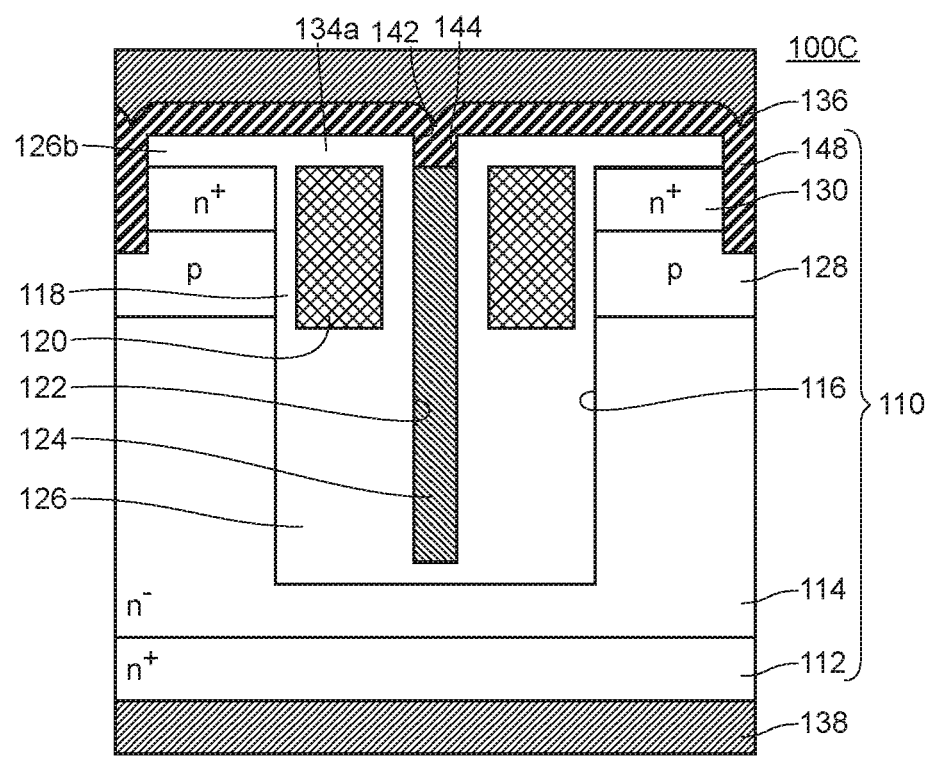
FIG. 10 is a cross-sectional view of a semiconductor device 100C of an embodiment 4.

A semiconductor device 100C of the embodiment 4 basically has substantially the same configuration as the semiconductor device 100A of the embodiment 2. However, the semiconductor device 100C of the embodiment 4 differs from the semiconductor device 100A of the embodiment 2 with respect to a point that a source electrode is connected to a source region through a metal plug. That is, in the semiconductor device 100C of the embodiment 4, as shown in FIG. 10, a second insulation film 126b is formed also between a source electrode 136 and a source region 130, a predetermined opening 146 is formed in the second insulation film 126b, and a metal plug 148 is formed by filling the inside of the opening 146 with metal.

In the semiconductor device 100C of the embodiment 4, the shield electrode connecting metal plug 144 and the metal plug 148 are made of the same kind of metal, and the metal is also stacked on the protective insulation film 134a. That is, the shield electrode connecting metal plug 144 and the metal plug 148 are connected to each other through metal formed on the protective insulation film 134a.

The semiconductor device 100C of the embodiment 4 can be manufactured by a method of manufacturing a semiconductor device of the embodiment 4 described hereinafter.

The method of manufacturing a semiconductor device of the embodiment 4 basically has substantially the same steps as the method of manufacturing a semiconductor device of the embodiment 2. However, the method of manufacturing a semiconductor device of the embodiment 4 differs from the method of manufacturing a semiconductor device of the embodiment 2 with respect to a point that the method of the embodiment 4 includes a shield electrode connecting metal plug-metal plug forming step in place of a metal plug forming step. That is, the method of manufacturing a semiconductor device of the embodiment 4, as shown in FIG. 11A to FIG. 11D, further includes: an opening forming step where a predetermined opening 146 is formed in the second insulation film 126b (see FIG. 11B) and a shield electrode connecting metal plug-metal plug forming step where the shield electrode connecting metal plug 144 is formed by filling the inside of a second gap 142 with metal, and a metal plug 148 is formed by filling the inside of the opening 146 with metal (see FIG. 11C) between a shield electrode forming step (see FIG. 5B) and a source electrode forming step (see FIG. 5D). In the method of manufacturing a semiconductor device according to the embodiment 4, the shield electrode connecting metal plug 144 and the metal plug 148 are collectively formed.

Figure 11A:
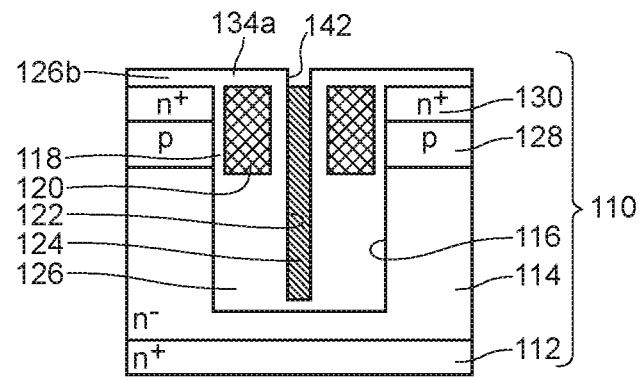
Figure 11B:
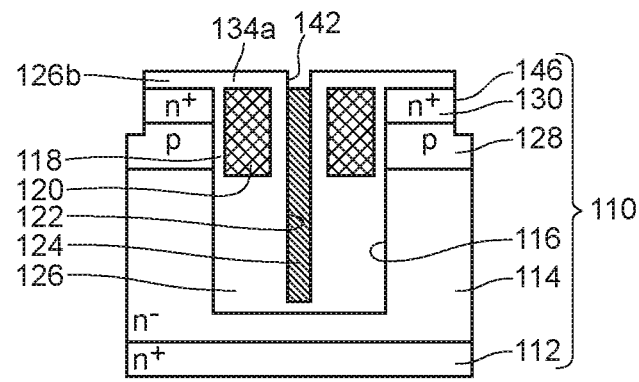
Figure 11C:
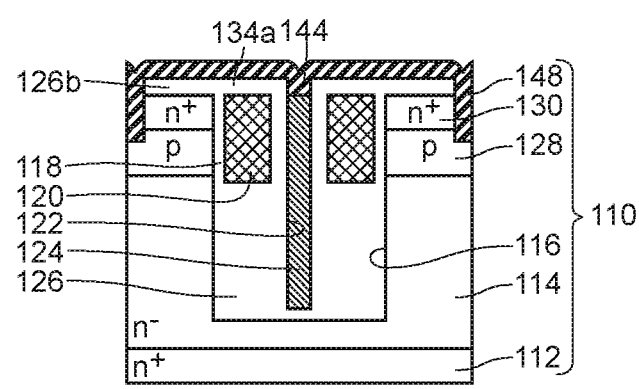

In the shield electrode connecting metal plug-metal plug forming step, metal is stacked on the whole surface of the semiconductor base body 110 on the second semiconductor layer 114 side (FIG. 11C).

Although the metal is stacked also in the second gap 142 and the outside of the opening 146, etching back is not performed. With such a configuration, it is possible to eliminate or omit an etching back step and hence, productivity of the semiconductor device can be enhanced. It is also possible to connect the shield electrode connecting metal plug 144 and the metal plug 148 using the same material and hence, it is possible to acquire an advantageous effect that the shield electrode connecting metal plug 144 and the metal plug 148 are minimally displaced from each other in a horizontal direction.

Figure 11D:
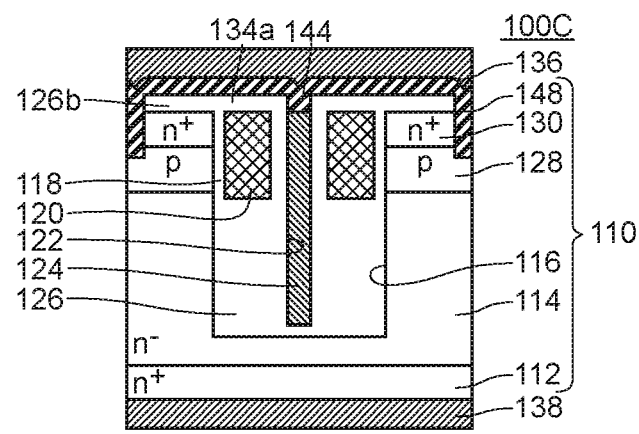

In the source electrode forming step, a source electrode 136 is formed such that the source electrode 136 is connected to a shield electrode 124 through the shield electrode connecting metal plug 144 and is connected to a source region 130 and a base region 128 through the metal plug 148 (see FIG. 11D).

In this manner, the method of manufacturing a semiconductor device of the embodiment 4 differs from the method of manufacturing a semiconductor device of the embodiment 2 with respect to a point that the method of the embodiment 4 includes the shield electrode connecting metal plug-metal plug forming step in place of the metal plug forming step. However, in the same manner as the method of manufacturing a semiconductor device of the embodiment 2, the method of manufacturing a semiconductor device of the embodiment 4 includes the shield electrode forming step as a step which comes after the gate electrode forming step and hence, the insulation films are not formed above the shield electrode 124 by a step which comes before the source electrode forming step. Accordingly, an insulation film removing step of removing the insulation films becomes unnecessary and hence, a step of establishing the connection between the shield electrode 124 and the source electrode 136 can be simplified.

The method of manufacturing a semiconductor device of the embodiment 4 includes the shield electrode connecting metal plug-metal plug forming step where the shield electrode connecting metal plug 144 is formed by filling the inside of the second gap 142 with metal, and the metal plug 148 is formed by filling the inside of the opening 146 with metal.

Accordingly, compared to the case where the shield electrode connecting metal plug 144 and the metal plug 148 are formed by different steps from each other, the shield electrode connecting metal plug 144 and the metal plug 148 can be formed with high productivity.

The method of manufacturing a semiconductor device of the embodiment 4 includes the above-mentioned shield electrode connecting metal plug-metal plug forming step. In the source electrode forming step, the source electrode 136 is formed such that the source electrode 136 is connected to the shield electrode 124 through the shield electrode connecting metal plug 144 and is connected to the source region 130 and the base region 128 through the metal plug 148. Both the shield electrode connecting metal plug 144 and the metal plug 148 play a role of an anchor against a slippage of the source electrode 136 in the horizontal direction. Accordingly, a slippage of the source electrode 136 in a horizontal direction minimally occurs also during a period of actual use (high and low temperature cycle) of the semiconductor device where the slippage of the source electrode 136 in a horizontal direction is liable to occur thus further enhancing stability of the electrode connection during a period of actual use (high and low temperature cycle) of the semiconductor device.

The method of manufacturing a semiconductor device of the embodiment 4 includes substantially the same steps as the method of manufacturing a semiconductor device of the embodiment 2 with respect to points other than the point that the method includes the shield electrode connecting metal plug-metal plug forming step in place of a metal plug forming step. Accordingly, the method of manufacturing a semiconductor device of the embodiment 4 acquires advantageous effects which correspond to advantageous effects out of advantageous effects which the method of manufacturing a semiconductor device of the embodiment 2 can acquire.

Embodiment 5

Figure 12:
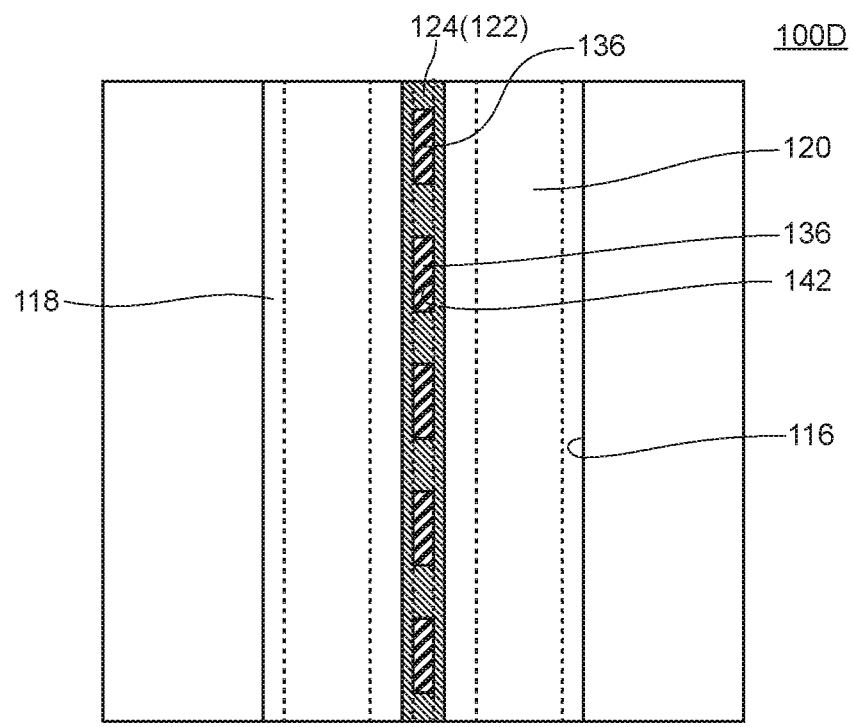
FIG. 12 is a cross-sectional plan view of a semiconductor device 100D of an embodiment 5 taken at a height position of a boundary between a second semiconductor layer 114 and a source electrode 136 in a state where a first trench 116 is not formed.

A semiconductor device 100D of the embodiment 5 basically has substantially the same configuration as the semiconductor device 100 of the embodiment 1. However, the semiconductor device 100D of the embodiment 5 differs from the semiconductor device 100 of the embodiment 1 with respect to a region where a second gap is formed. That is, in the semiconductor device 100D of the embodiment 5, as shown in FIG. 12, as viewed in a plan view, only in a predetermined region of a region where a first gap 122 is formed, the second gaps 142 are formed.

The second gaps 142 are formed at a predetermined pitch. The inside of the second gap 142 is filled with metal which forms the source electrode 136.

The semiconductor device 100D of the embodiment 5 can be manufactured by a method of manufacturing a semiconductor device of the embodiment 5 described hereinafter.

The method of manufacturing a semiconductor device of the embodiment 5 (not shown in the drawing) basically has substantially the same steps as the method of manufacturing a semiconductor device of the embodiment 1. However, the method of manufacturing a semiconductor device of the embodiment 5 differs from the method of manufacturing a semiconductor device of the embodiment 1 with respect to a region where the second gap is formed. That is, in the shield electrode etching back step of the method of manufacturing a semiconductor device of the embodiment 5, as viewed in a plan view, only in the predetermined region of the region where the first gap 122 is formed, the second gaps 142 are formed. In the embodiment 5, the second gaps 142 are formed at predetermined pitch.

In this manner, the method of manufacturing a semiconductor device of the embodiment 5 differs from the method of manufacturing a semiconductor device of the embodiment 1 with respect to the region where the second gap is formed. However, in the same manner as the method of manufacturing a semiconductor device of the embodiment 1, the method of manufacturing a semiconductor device of the embodiment 5 includes a shield electrode forming step as a step which comes after a gate electrode forming step and hence, the insulation films are not formed above the shield electrode 124 by a step which comes before a source electrode forming step.

Accordingly, an insulation film removing step of removing the insulation films becomes unnecessary and hence, a step of establishing the connection between the shield electrode 124 and the source electrode 136 can be simplified.

Further, in the shield electrode etching back step of the method of manufacturing a semiconductor device of the embodiment 5, as viewed in a plan view, only in the predetermined region of the region where the first gap 122 is formed, the second gaps 142 are formed. With such a configuration, a state is brought about where the source electrode and the shield electrode are electrically connected to each other in a state where an anchor effect is acquired not only in a direction extending toward the other gate electrode from one gate electrode but also in a direction perpendicular to such a direction in the inside of a first trench 116. Accordingly, even during a period of actual use (high and low temperature cycle) of the semiconductor device where a slippage of the source electrode 136 in these directions is liable to occur, such a slippage minimally occurs thus enhancing stability of the electrode connection during a period of actual use (high and low temperature cycle) of the semiconductor device.

The method of manufacturing a semiconductor device of the embodiment 5 includes substantially the same steps as the method of manufacturing a semiconductor device of the embodiment 1 with respect to points other than the point that the method includes the metal plug forming step and hence, the method of manufacturing a semiconductor device of the embodiment 5 acquires advantageous effects which correspond to advantageous effects out of advantageous effects which the method of manufacturing a semiconductor device of the embodiment 1 can acquire.

Embodiment 6

Figure 13:
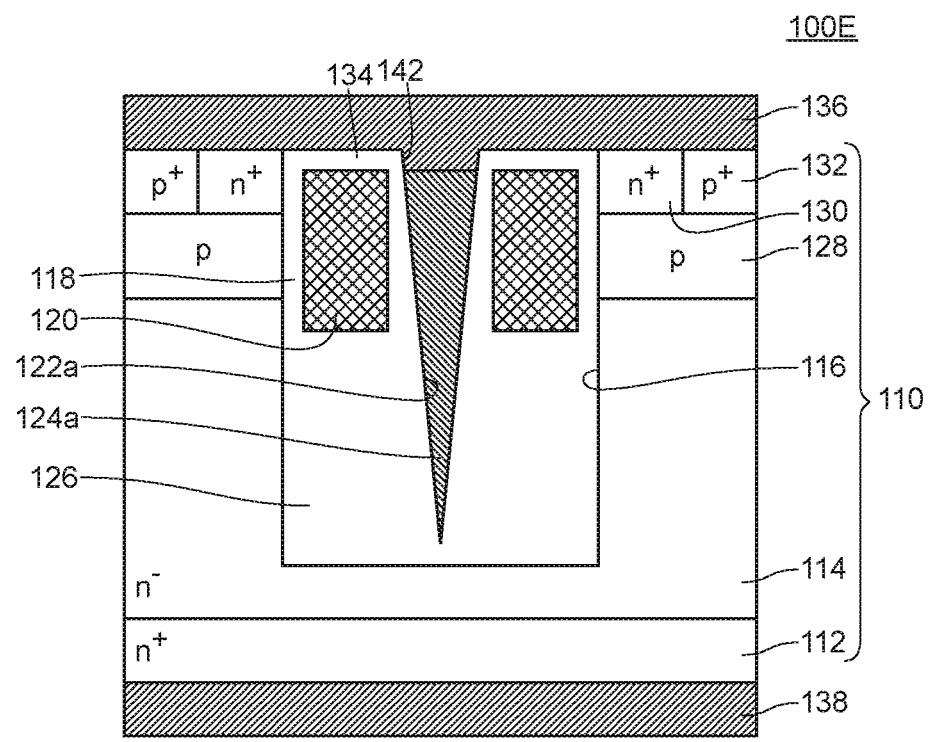
FIG. 13 is a cross-sectional view of a semiconductor device 100E of an embodiment 6.

A semiconductor device 100E of the embodiment 6 basically has substantially the same configuration as the semiconductor device 100 of the embodiment 1. However, the semiconductor device 100E of the embodiment 6 differs from the semiconductor device 100 of the embodiment 1 with respect to a shape of a shield electrode. That is, in the semiconductor device 100E of the embodiment 6, as shown in FIG. 13, the shield electrode 124a has side surfaces which form a bottom narrowed tapered shape thus having an inverted triangular shape.

The semiconductor device 100E of the embodiment 6 can be manufactured by a method of manufacturing a semiconductor device of the embodiment 6 described hereinafter.

Figure 14A:
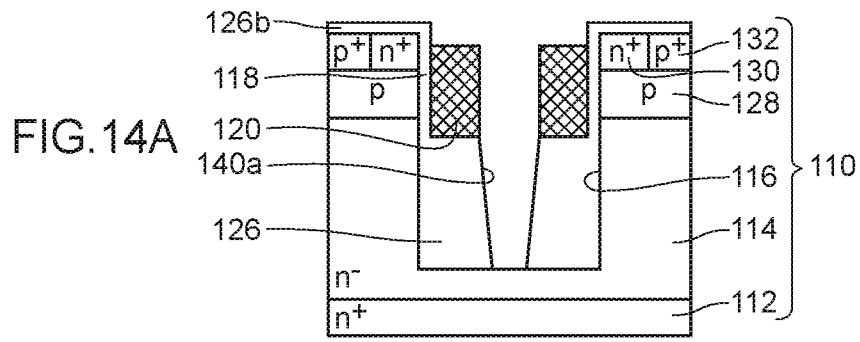
FIG. 14A to FIG. 14D are cross-sectional views for describing respective steps of a method of manufacturing a semiconductor device of the embodiment 6.

The method of manufacturing a semiconductor device of the embodiment 6 basically has substantially the same steps as the method of manufacturing a semiconductor device of the embodiment 1. However, the method of manufacturing a semiconductor device of the embodiment 6 differs from the method of manufacturing a semiconductor device of the embodiment 1 with respect to a shape of a second trench. That is, in a second trench forming step of the method of manufacturing a semiconductor device of the embodiment 6, as shown in FIG. 14A, a trench having side surfaces which form a bottom narrowed tapered shape is formed as the second trench 140a. In the second trench forming step, a trench having side surfaces which form a bottom narrowed tapered shape is formed by adjusting conditions of an etching gas (a kind, a temperature and the like of the etching gas).

Figure 14B:
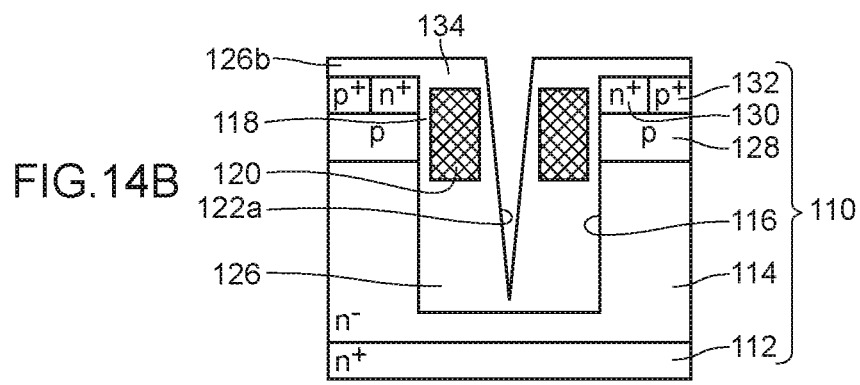

Then, in a second insulation film forming step, a first gap 122a also has side surfaces which form a bottom narrowed tapered shape for forming a second insulation film 126b along a surface of the second trench 140a (to be more specific, the first gap 122a having a triangular shape extending downward in a convex shape) (see FIG. 14B).

Figure 14C:
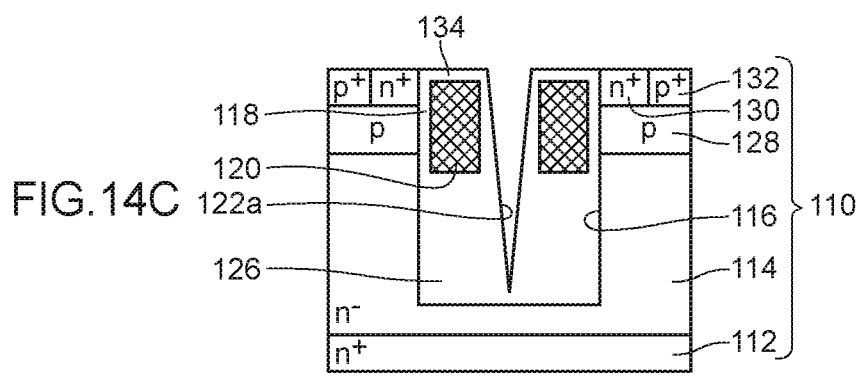
Figure 14D:
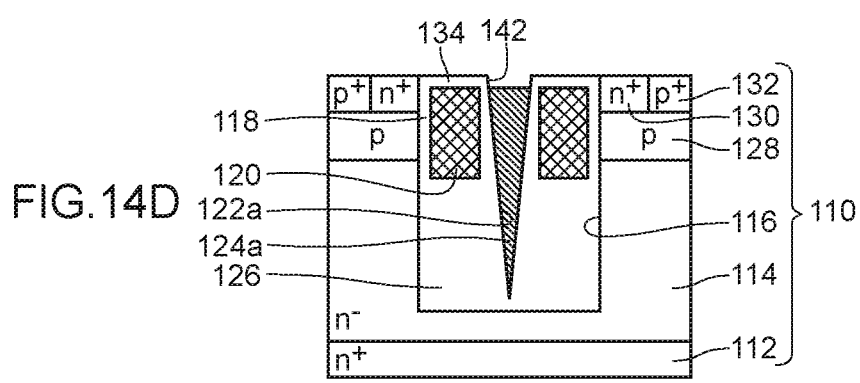
Figure 15A:
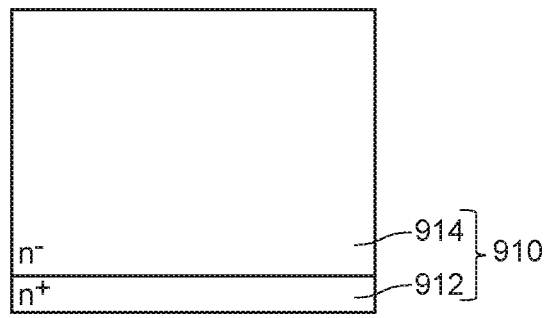
FIG. 15A to FIG. 15D are views for describing respective steps of a conventional method of manufacturing a semiconductor device.
Figure 15B:
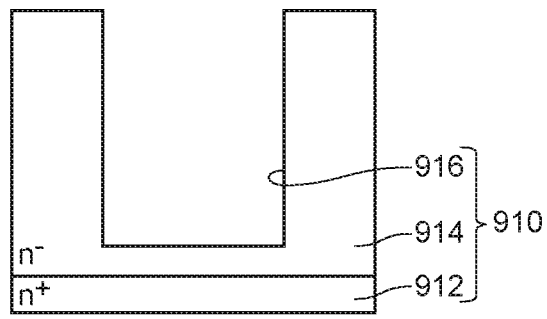
Figure 15C:
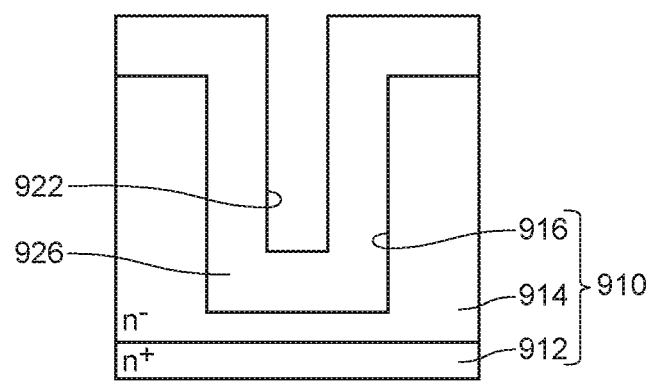
Figure 15D:
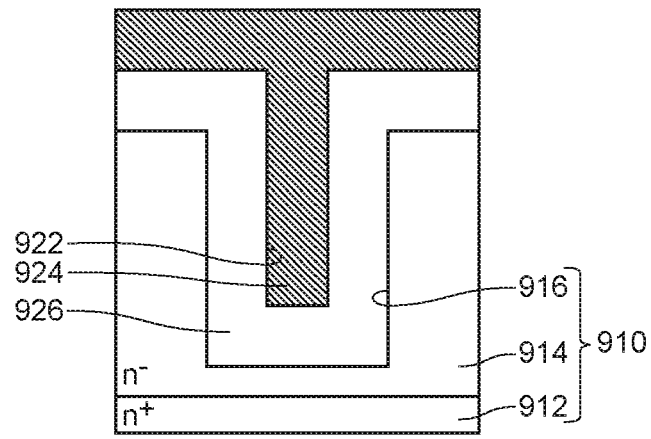
Figure 16A:
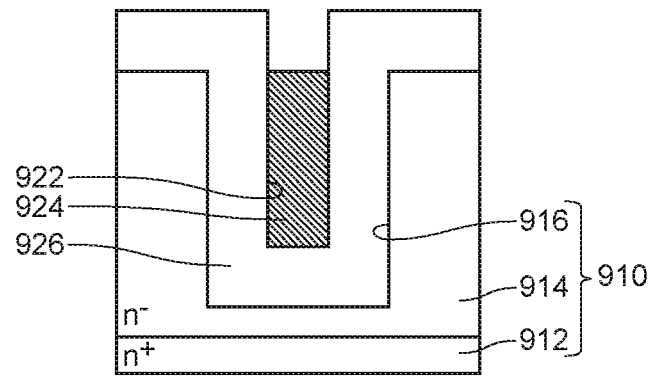
FIG. 16A to FIG. 16D are views for describing respective steps of a conventional method of manufacturing a semiconductor device.
Figure 16B:
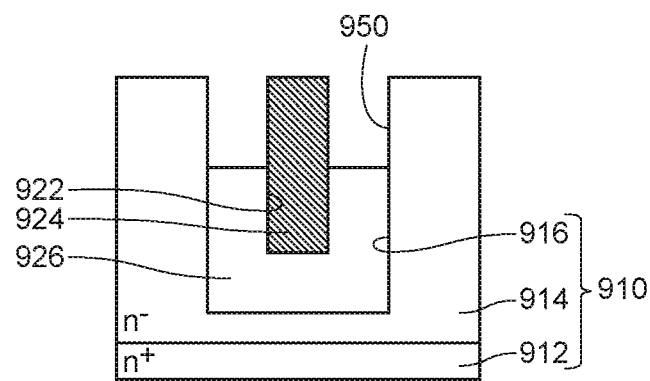
Figure 16C:
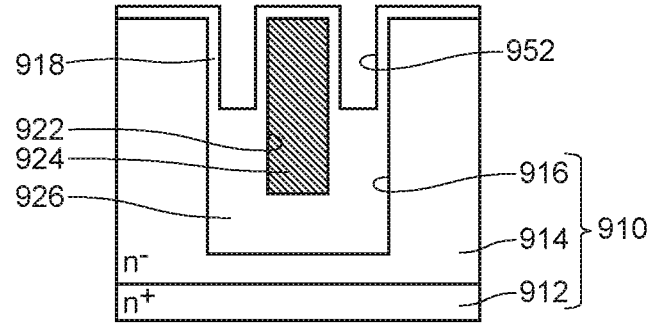
Figure 16D:
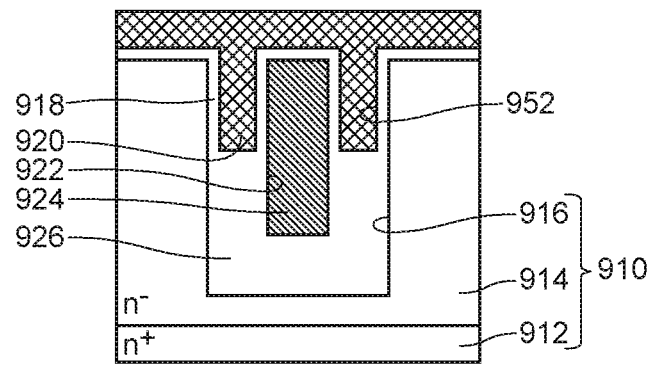
Figure 17A:
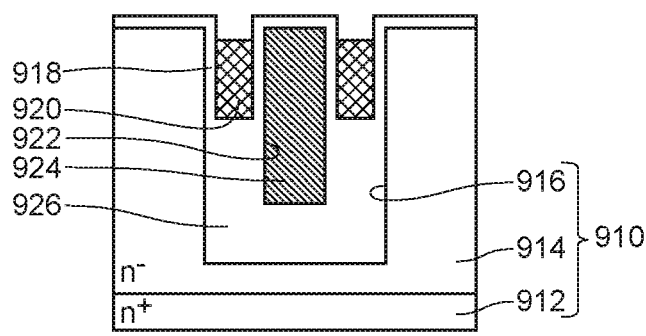
FIG. 17A to FIG. 17D are views for describing respective steps of a conventional method of manufacturing a semiconductor device.
Figure 17B:
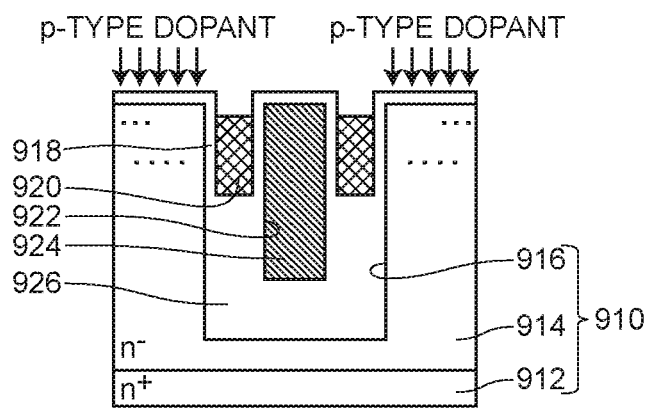
Figure 17C:
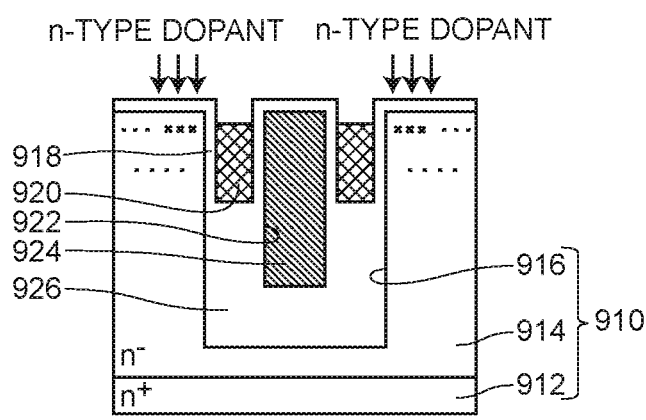
Figure 17D:
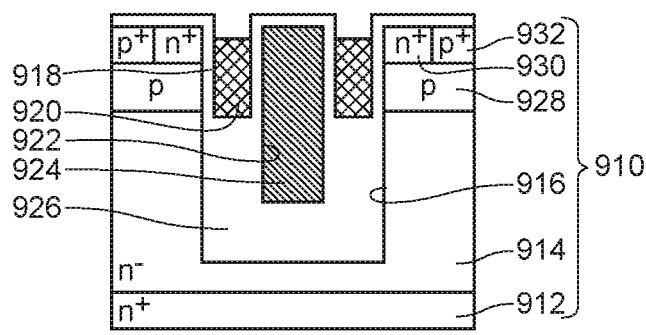
Figure 18A:
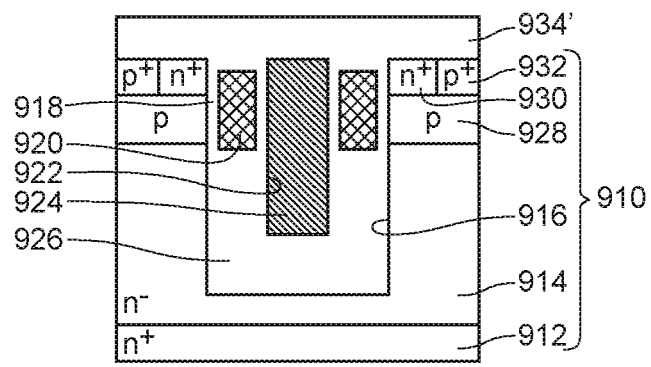
FIG. 18A to FIG. 18C are views for describing respective steps of a conventional method of manufacturing a semiconductor device (symbol 938 indicating a drain electrode in FIG. 18C)
Figure 18B:
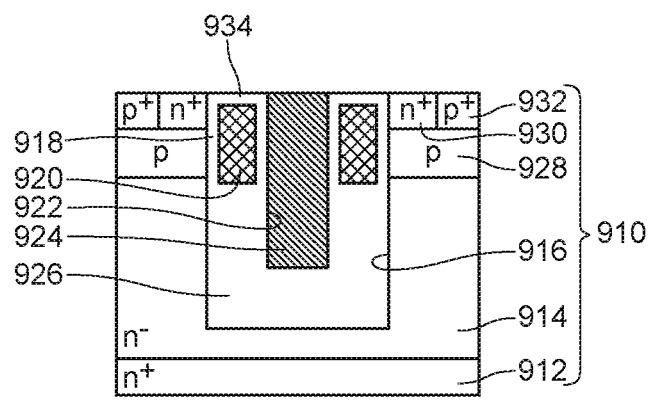
Figure 18C:
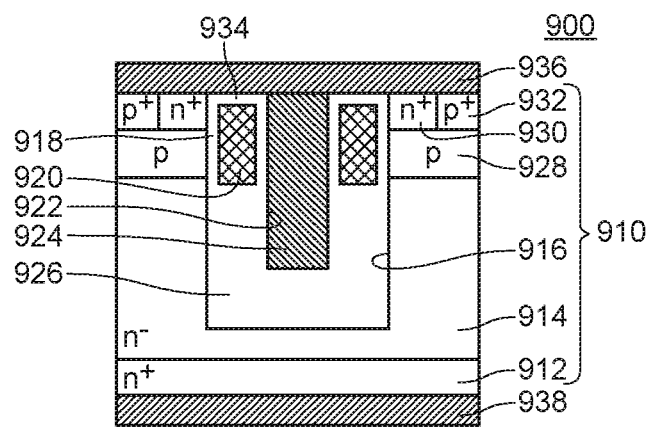

Then, after a second insulation film etching back step is performed (see FIG. 14C), in the shield electrode forming step, a shield electrode 124a having side surfaces which form a bottom narrowed tapered shape can be formed by filling polysilicon into the above-mentioned first gap 122a (see FIG. 14D).

In this manner, the method of manufacturing a semiconductor device of the embodiment 6 differs from the method of manufacturing a semiconductor device of the embodiment 1 with respect to the shape of the second trench. However, in the same manner as the method of manufacturing a semiconductor device of the embodiment 1, the method of the embodiment 6 includes the shield electrode forming step as a step which comes after the gate electrode forming step and hence, the insulation films are not formed above the shield electrode 124 by a step which comes before the source electrode forming step. Accordingly, an insulation film removing step of removing the insulation films becomes unnecessary and hence, a step of establishing the connection between the shield electrode 124 and the source electrode 136 can be simplified.

According to the method of manufacturing a semiconductor device of the embodiment 6, in the second trench forming step, the trench having side surfaces which form a bottom narrowed tapered shape is formed as the second trench 140a and hence, a voltage applied to an upper portion of the shield electrode 124a becomes higher than a voltage applied to a lower portion of the shield electrode 124a. Accordingly, at the time of switching off the semiconductor device, a change in potential of a drain electrode can be alleviated and hence, a surge voltage can be lowered at the time of switching off the semiconductor device.

The method of manufacturing a semiconductor device of the embodiment 6 includes substantially the same steps as the method of manufacturing a semiconductor device of the embodiment 1 with respect to points other than the shape of the second trench and hence, the method of manufacturing a semiconductor device of the embodiment 6 acquires advantageous effects which correspond to advantageous effects out of advantageous effects which the method of manufacturing a semiconductor device of the embodiment 1 can acquire.

Although the present invention has been described based on the above-mentioned embodiments heretofore, the present invention is not limited to the above-mentioned embodiments. The present invention can be carried out in various modes without departing from the gist of the present invention. For example, the following modifications of the present invention are conceivable.

(1) The number, materials, shapes, positions, sizes and the like of the constitutional elements described in the above-mentioned embodiments are merely examples, and can be changed within a range where the advantageous effects of the present invention are not impaired.

(2) In the above-mentioned respective embodiments, the first insulation film is formed by a CVD method. However, the present invention is not limited to such a method. The first insulation film may be formed by a thermal oxidation method.

(3) In the above-mentioned respective embodiments, the second insulation film is formed by a thermal oxidation method. However, the present invention is not limited to such a method. The second insulation film may be formed by a CVD method.

(4) In the second trench forming steps in the above-mentioned respective embodiments, the second trench is formed such that the second trench reaches a depth position of the first trench. However, the present invention is not limited to such second trench forming steps. In the second trench forming step, the second trench may be formed such that the second trench reaches a depth position deeper than a depth position of the first trench, or the second trench may be formed such that the second trench reaches a depth position shallower than the depth position of the first trench.

(5) In the second insulation film forming steps in the above-mentioned respective embodiments, the second insulation film is formed such that the relationship of D1<d+D2 is satisfied. However, the present invention is not limited to such a relationship. In the second insulation film forming step, the second insulation film may be formed such that a relationship of D1=d+D2 is satisfied. In this case, in the second trench forming step, the second trench is formed such that the second trench reaches a depth position shallower than a depth position of the first trench.

(6) In the above-mentioned respective embodiments, polysilicon is used as a material for forming the shield electrode. However, the present invention is not limited to such a material. Metal may be used as a material for forming the shield electrode.

(7) In the above-mentioned respective embodiments, the method of manufacturing a semiconductor device may further include, between the second trench forming step and the second insulation film forming step, a second conductive type diffusion region forming step of forming a second conductive type diffusion region (p-type diffusion region) such that the second conductive type diffusion region is brought into contact with the bottom of the second trench.

(8) In the above-mentioned respective embodiments, an n-type dopant is injected after a p-type dopant is injected. However, the present invention is not limited to such a dopant injection method. A p-type dopant may be injected after an n-type dopant is injected. Further, in the above-mentioned respective embodiments, dopants are collectively activated after a p-type dopant and an n-type dopant are injected. However, the present invention is not limited to such a dopant injection method. Dopant activation may be performed every time after each dopant is injected.

(9) In the above-mentioned respective embodiments, the base region 128, the source region 130 and the contact region 132 are formed before the shield electrode is formed. However, the present invention is not limited to such an order of forming these regions. The base region 128, the source region 130 and the contact region 132 may be formed after the shield electrode is formed.

(10) In the above-mentioned respective embodiments, the trench (first trench), the gate electrode and the shield electrode are respectively formed into a stripe shape as viewed in a plan view. However, the present invention is not limited to such a configuration. The trench (first trench), the gate electrode and the shield electrode may be respectively formed in a grid shape or a dot shape (a columnar shape as viewed stereoscopically) as viewed in a plan view.

(11) In the above-mentioned embodiment 5, the second gaps are formed at a predetermined interval. However, the present invention is not limited to such a configuration. The second gaps may be formed at a desired interval.

(12) In the above-mentioned respective embodiments, the description has been made by taking a MOSFET as an example of the semiconductor device. However, the present invention is not limited to such a case. The present invention is applicable to various other devices besides a MOSFET without departing from the gist of the present invention.

The invention claimed is:

1. A method of manufacturing a semiconductor device having a shield gate structure where a gate electrode and a shield electrode are separated from each other in an in-plane direction, the method comprising in the following order:
   a semiconductor base body preparing step of preparing a semiconductor base body having a first conductive-type first semiconductor layer and a first conductive-type second semiconductor layer having lower concentration than the first semiconductor layer;
   a first trench forming step of forming a predetermined first trench on the second semiconductor layer;
   a first insulation film forming step of forming a first insulation film such that the first insulation film is filled in a lower portion of the first trench;
   a gate insulation film forming step of forming a gate insulation film on a side wall of an upper portion of the first trench;
   a gate electrode forming step of forming the gate electrode made of polysilicon with the gate insulation film interposed between the upper portion of the first trench and the gate electrode;
   a second trench forming step of forming a second trench in the inside of the first trench by removing a center portion of the first insulation film by etching;
   a second insulation film forming step of forming a second insulation film at least in the inside of the second trench under a condition that a first gap remain in the inside of the second trench;
   a shield electrode forming step of forming the shield electrode in the inside of the first gap;
   a shield electrode etching back step of forming a second gap in an upper portion of the first gap by removing a portion of the shield electrode by etching back; and
   a source electrode forming step of forming a source electrode such that the source electrode is electrically connected to the shield electrode.

2. The method of manufacturing a semiconductor device according to claim 1, wherein
   in the second insulation film forming step, the second insulation film is formed also on the gate electrode, and
   in the shield electrode etching back step, a depth position of an upper surface of the shield electrode as measured from a surface of the second insulation film formed on the gate electrode which is used as a reference is set to a value which falls within a range of from 0.01 μm to 2 μm.

3. The method of manufacturing a semiconductor device according to claim 1, wherein in the source electrode forming step, the source electrode is formed such that the source electrode is directly connected to the shield electrode.

4. The method of manufacturing a semiconductor device according to claim 1, further comprising a shield electrode connecting metal plug forming step of forming a shield electrode connecting metal plug by filling the second gap with metal between the shield electrode etching back step and the source electrode forming step, wherein
   in the source electrode forming step, the source electrode is formed such that the source electrode is connected to the shield electrode through the shield electrode connecting metal plug.

5. The method of manufacturing a semiconductor device according to claim 1, wherein in the shield electrode etching back step, the second gap is formed only in a predetermined region of a region where the first gap is formed as viewed in a plan view.

6. The method of manufacturing a semiconductor device according to claim 1, wherein in the second trench forming step, a trench having side surfaces which form a bottom narrowed tapered shape is formed as the second trench.

7. The method of manufacturing a semiconductor device according to claim 1, further comprising: a base region forming step of forming a second conductive-type base region on a surface of the second semiconductor layer in a region where the first trench is not formed as viewed in a plan view; and a first conductive-type high concentration diffusion region forming step of forming a first conductive-type high concentration diffusion region on a surface of the base region such that at least a portion of the first conductive-type high concentration diffusion region is exposed on the side wall of the first trench between the gate electrode forming step and the second trench forming step.

8. The method of manufacturing a semiconductor device according to claim 7, further comprising:
   a second conductive-type high concentration diffusion region forming step of forming a second conductive-type high concentration diffusion region in a predetermined region of a surface of the base region between the gate electrode forming step and the second trench forming step; and
   a second insulation film etching back step where the second insulation film in a region where the first trench is not formed as viewed in a plan view is removed by etching back between the shield electrode forming step and the source electrode forming step, wherein
   in the source electrode forming step, the source electrode is formed such that the source electrode is directly connected to the shield electrode, the first conductive-type high concentration diffusion region and the second conductive-type high concentration diffusion region.

9. The method of manufacturing a semiconductor device according to claim 7, further comprising: an opening forming step of forming a predetermined opening in the second insulation film; and a metal plug forming step of forming a metal plug by filling the inside of the opening with metal between the shield electrode forming step and the source electrode forming step, wherein in the source electrode forming step, the source electrode is formed such that the source electrode is directly connected to the shield electrode and is connected to the first conductive-type high concentration diffusion region and the base region through the metal plug.

10. The method of manufacturing a semiconductor device according to claim 7, further comprising: an opening forming step of forming a predetermined opening in the second insulation film; and a shield electrode connecting metal plug-metal plug forming step of forming a shield electrode connecting metal plug by filling the second gap with metal and forming a metal plug by filling the inside of the opening with metal between the shield electrode etching back step and the source electrode forming step, wherein in the source electrode forming step, the source electrode is formed such that the source electrode is connected to the shield electrode through the shield electrode connecting metal plug and is connected to the first conductive-type high concentration diffusion region and the base region through the metal plug.

11. The method of manufacturing a semiconductor device according to claim 1, wherein in the second insulation film forming step, the second insulation film is formed such that a thickness of the second insulation film is larger than a thickness of the gate insulation film.

12. The method of manufacturing a semiconductor device according to claim 1, wherein in the second insulation film forming step, assuming a thickness of the second insulation film between a bottom of the first gap and a bottom of the first trench as D1, a thickness of the first insulation film between a side wall of the first gap at a depth position of the bottom of the first gap and a side wall of the first trench as d, and a thickness of the second insulation film between the side wall of the first gap at the depth position of the bottom of the first gap and the side wall of the first trench as D2, the second insulation film is formed such that a relationship of $D1 \leq d + D2$ is satisfied.

13. The method according to claim 1, wherein
the gate electrode forming step comprises forming a first gate electrode and a second gate electrode in the first trench, and
the second trench forming step comprises forming the second trench by removing the center portion of the first insulating film between the first gate electrode and the second gate electrode.

14. The method according to claim 13, wherein forming the second trench comprises forming the second trench aligned with a surface of the first gate electrode and a surface of the second gate electrode.

15. The method according to claim 13, wherein forming the second trench comprises defining the first gap between the first gate electrode and the second gate electrode.

16. The method according to claim 1, wherein forming the second insulation film comprises forming the second insulation film covering the gate electrode.

17. The method according to claim 1, wherein the shield electrode is formed after forming the gate electrode.

* * * * *